United States Patent
Teng et al.

(10) Patent No.: US 11,282,791 B2
(45) Date of Patent: Mar. 22, 2022

(54) SEMICONDUCTOR DEVICE HAVING A HEAT DISSIPATION STRUCTURE CONNECTED CHIP PACKAGE

(71) Applicant: Taiwan Semiconductor Manufacturing Co., Ltd., Hsinchu (TW)

(72) Inventors: Po-Yuan Teng, Hsinchu (TW); Hung-Yi Kuo, Taipei (TW); Hao-Yi Tsai, Hsinchu (TW); Tin-Hao Kuo, Hsinchu (TW); Yu-Chia Lai, Miaoli County (TW); Shih-Wei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 47 days.

(21) Appl. No.: 16/454,086

(22) Filed: Jun. 27, 2019

(65) Prior Publication Data
US 2020/0411439 A1 Dec. 31, 2020

(51) Int. Cl.
| H01L 23/538 | (2006.01) |
| H01L 23/31 | (2006.01) |
| H01L 23/473 | (2006.01) |
| H01L 23/36 | (2006.01) |
| H01L 25/11 | (2006.01) |
| H01L 25/07 | (2006.01) |
| H01L 25/065 | (2006.01) |
| H01L 21/56 | (2006.01) |

(Continued)

(52) U.S. Cl.
CPC ........ *H01L 23/5382* (2013.01); *H01L 21/485* (2013.01); *H01L 21/4853* (2013.01); *H01L 21/4857* (2013.01); *H01L 21/4882* (2013.01); *H01L 21/563* (2013.01); *H01L 23/3157* (2013.01); *H01L 23/473* (2013.01); *H01L 23/5383* (2013.01); *H01L 23/5386* (2013.01); *H01L 23/367* (2013.01); *H01L 25/0657* (2013.01); *H01L 25/074* (2013.01); *H01L 25/0756* (2013.01); *H01L 25/117* (2013.01); *H01L 2225/1011* (2013.01)

(58) Field of Classification Search
CPC ............. H01L 23/5382; H01L 23/3157; H01L 23/473; H01L 23/5383; H01L 23/5386; H01L 23/36; H01L 23/367; H01L 25/117; H01L 25/0756; H01L 25/0657; H01L 25/074; H01L 2225/1011
See application file for complete search history.

(56) References Cited

U.S. PATENT DOCUMENTS 5,671,121 A * 9/1997 McMahon .............. H01L 23/36
257/724
6,639,360 B2 * 10/2003 Roberts ................. H01L 51/529
313/512

(Continued)

*Primary Examiner* — Ida M Soward
(74) *Attorney, Agent, or Firm* — JCIPRNET

(57) ABSTRACT

A semiconductor device includes a first chip package, a heat dissipation structure and an adapter. The first chip package includes a semiconductor die laterally encapsulated by an insulating encapsulant, the semiconductor die has an active surface and a back surface opposite to the active surface. The heat dissipation structure is connected to the chip package. The adapter is disposed over the first chip package and electrically connected to the semiconductor die.

20 Claims, 22 Drawing Sheets

(51) Int. Cl.
*H01L 21/48* (2006.01)
*H01L 25/075* (2006.01)
*H01L 23/367* (2006.01)

(56) References Cited

U.S. PATENT DOCUMENTS

| | | | |
|---|---|---|---|
| 7,671,465 B2 * | 3/2010 | Funakoshi | H01L 24/37 257/706 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,076,754 B2 * | 7/2015 | Hung | H01L 23/42 |
| 9,082,743 B2 * | 7/2015 | Hung | H01L 24/32 |
| 9,111,949 B2 | 8/2015 | Yu et al. | |
| 9,240,394 B1 * | 1/2016 | Ben Jamaa | H01L 24/17 |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,761,571 B2 * | 9/2017 | Scanlan | H01L 23/3128 |
| 10,515,867 B2 * | 12/2019 | Wu | H01L 24/32 |
| 10,559,538 B2 * | 2/2020 | Fujino | H01L 23/562 |
| 10,763,218 B2 * | 9/2020 | Chigullapalli | H05K 9/0015 |
| 2006/0103011 A1 * | 5/2006 | Andry | H01L 25/0657 257/707 |
| 2006/0113663 A1 * | 6/2006 | Yuan | H01L 23/4334 257/718 |
| 2009/0087948 A1 * | 4/2009 | Lange | H01L 23/3107 438/108 |
| 2009/0122486 A1 * | 5/2009 | Mouli | H01L 23/373 361/697 |
| 2009/0296360 A1 * | 12/2009 | Doblar | H05K 7/1061 361/767 |
| 2011/0215354 A1 * | 9/2011 | Wang | H01L 33/58 257/98 |
| 2012/0146207 A1 * | 6/2012 | Chou | H01L 23/3675 257/690 |
| 2014/0264821 A1 * | 9/2014 | Tang | H01L 23/3675 257/713 |
| 2015/0279761 A1 * | 10/2015 | Bet-Shliemoun | H01L 23/42 257/714 |
| 2016/0133602 A1 * | 5/2016 | Chen | H01L 23/3675 257/712 |
| 2018/0145050 A1 * | 5/2018 | Lu | H05K 3/42 |
| 2018/0151472 A1 * | 5/2018 | Chen | H01L 23/3736 |
| 2018/0366444 A1 * | 12/2018 | Chiu | H01L 25/0657 |
| 2020/0058571 A1 * | 2/2020 | Wang | H01L 21/4882 |
| 2020/0105644 A1 * | 4/2020 | Teng | H01L 24/19 |
| 2020/0126883 A1 * | 4/2020 | Wang | H01L 23/36 |
| 2020/0194364 A1 * | 6/2020 | Duran | H01L 23/49861 |

* cited by examiner

SEMICONDUCTOR DEVICE HAVING A HEAT DISSIPATION STRUCTURE CONNECTED CHIP PACKAGE

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated packages, such as Fan-Out Wafer Level Package (FOWLP), Chip on Wafer on Substrate (CoWoS) package and so on, are becoming increasingly popular for their compactness. As the integration density increased, the power of the semiconductor components increases (i.e. over 16 kw/rack) to handle complicated operation. The more power inputs, the more heat is generated by the semiconductor components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
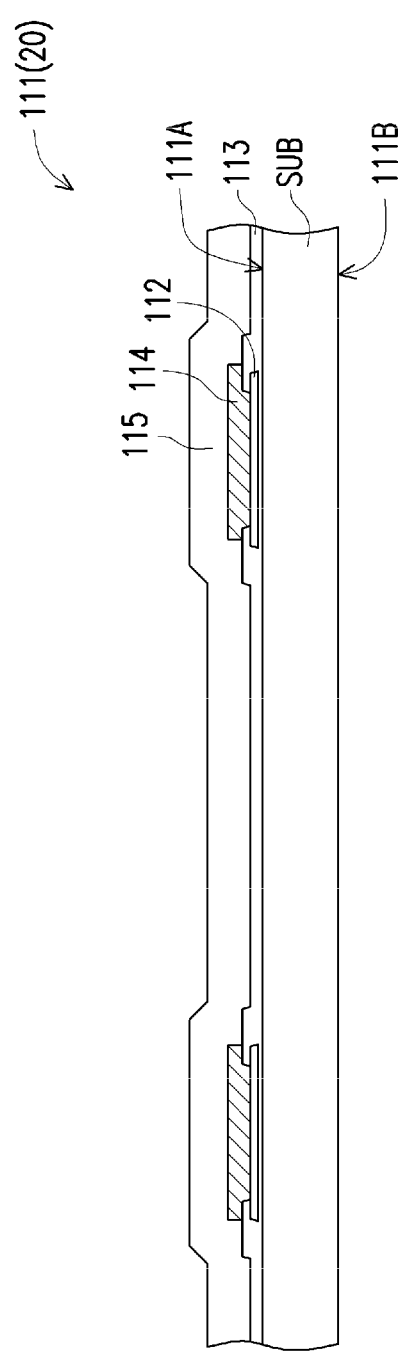
FIG. 1 through FIG. 4 and FIG. 6 through FIG. 11 illustrate a process flow for fabricating a semiconductor device in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Figure 21:
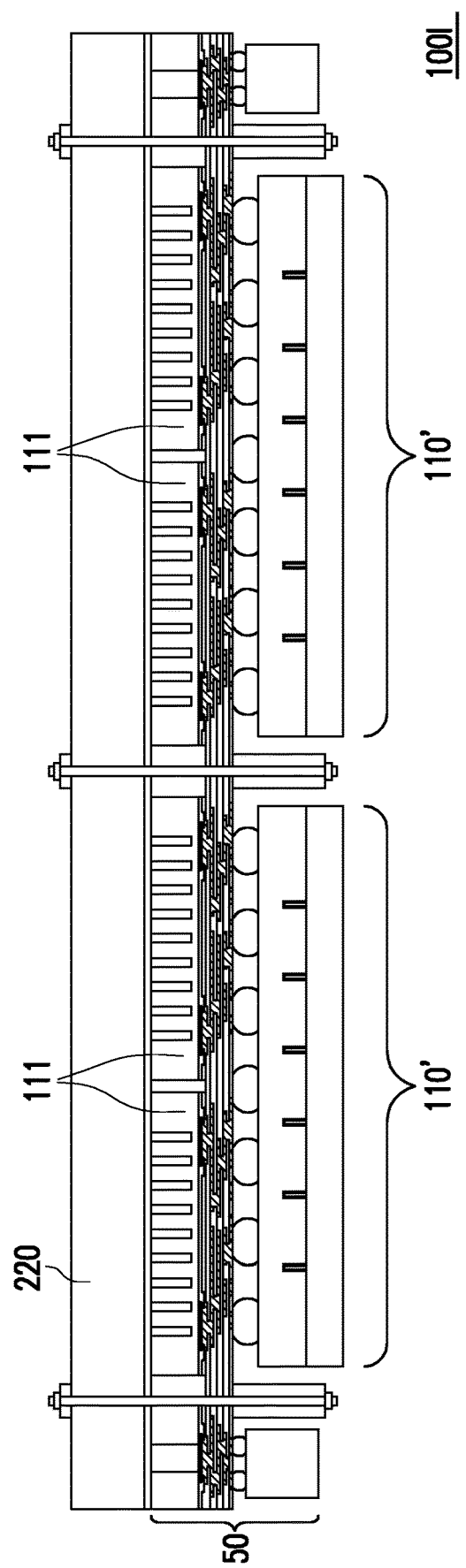
FIG. 21 illustrates alternative embodiments of the semiconductor device in accordance with some embodiments of the present disclosure.

FIG. 1 through FIG. 4 and FIG. 6 through 11 illustrate a process flow for fabricating a semiconductor device in accordance with some embodiments of the present disclosure. In FIG. 1 through FIG. 4 and FIG. 6 through FIG. 10, a single semiconductor die is shown to represent plural semiconductor dies 111 in a wafer of a wafer-level process, and a combination of a chip package and a heat dissipation structure shown FIG. 11 through 19 represent various alternative embodiments of semiconductor devices obtained following the fabricating method. In FIG. 21, multiple chip packages in wafer-level package form is assembled with a heat dissipation structure, in accordance to yet another alternative embodiment. In other embodiments, two or more dies represent plural chips or dies of the wafer, and one or more package structures represent plural semiconductor devices obtained following the fabricating method, the disclosure is not limited thereto.

Referring to FIG. 1, FIG. 1 illustrates the formation of an initial structure of semiconductor die, which may be a part of wafer 20 that includes a plurality of semiconductor dies 111 therein. The semiconductor dies 111 includes a substrate SUB. The semiconductor dies 111 may include active components (e.g., transistors or the like) and passive components (e.g., resistors, capacitors, inductors or the like) formed in the substrate SUB. In accordance with some embodiments of the present disclosure, the semiconductor dies 111 includes a crystalline silicon substrate. In accordance with other embodiments of the present disclosure, the semiconductor dies 111 includes an elementary semiconductor substrate such as germanium; a compound semiconductor substrate including silicon carbon, gallium arsenic, gallium phosphide, indium phosphide, indium arsenide, and/or indium antimonide; an alloy semiconductor substrate including SiGe, GaAsP, AlInAs, AlGaAs, GaInAs, GaInP, and/or GaInAsP; or combinations thereof. Other semiconductor substrates such as multi-layered or gradient substrates may also be used. The substrate SUB of the semiconductor dies 111 includes an active surface 111A and a back surface 111B opposite to the active surface 111A, as illustrated in FIG. 1. The active surface 111A of the substrate SUB may be referred to as the top surface of the substrate SUB, and a back surface 111B may be referred to as the bottom surface of the substrate SUB, for example.

In some embodiments, the semiconductor dies 111 or the wafer 20 may include connection pads 112 and a passivation layer 113. The connection pads 112 are formed on the active surface 111A of the substrate SUB to physically and electrically connect the active device, passive device or integrated circuit in the substrate SUB and include a conductive material such as aluminum (Al), copper (Cu), or other suitable metal. The passivation layer 113 such as an oxide film, a nitride film, a dielectric film (such as benzocyclobutene (BCB), polybenzoxazole (PBO)), or the like, is formed on the active surface 111A of the substrate SUB and expose portions of the connection pads 112.

Figure 3:
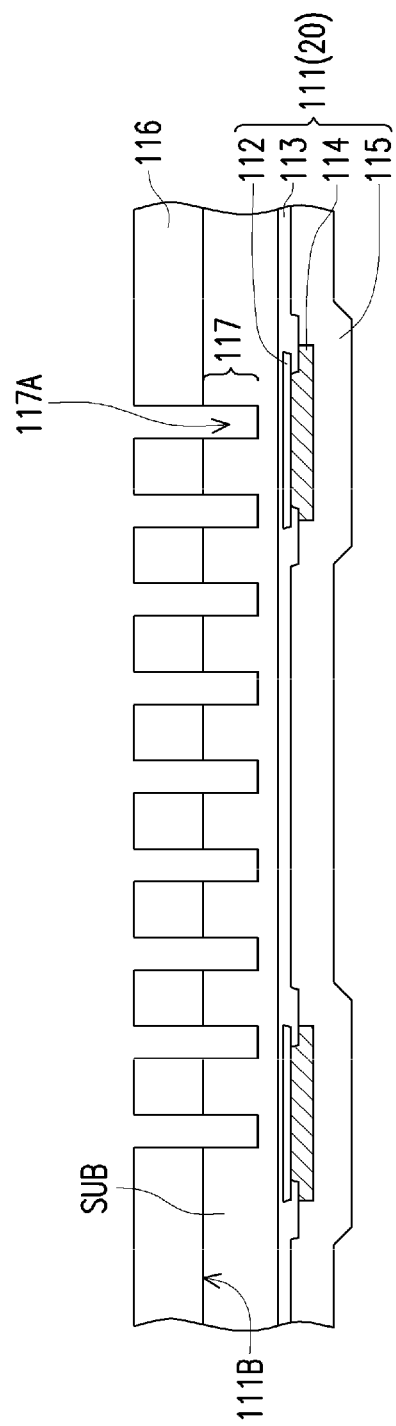

Next, in some embodiments, once the patterned mask layer 116 is formed on the back surface 111B of semiconductor dies 111 or the wafer 20, an etching process is performed to form a thermal enhancement pattern 117 shown in FIG. 3. The etching process may include a wet etching process, which may use KOH, Tetra Methyl Ammonium Hydroxide (TMAH), or the like as an etchant. After the thermal enhancement pattern 117 is formed on the back surface 111B of the substrate SUB of the semiconductor dies 111, the patterned mask layer 116 is removed from the back surface 111B of the semiconductor dies 111. In some embodiments, the thermal enhancement pattern 117 includes recesses 117A which extend from the back surface 111B of the substrate SUB into the interior of the substrate SUB. As illustrated in FIG. 3, the depth of the recesses 117A is less than the thickness of the substrate SUB of the semiconductor dies 111 or the wafer 20. For example, the depth of the recesses 117 is about 60% to about 20% of the thickness of the substrate SUB of the semiconductor dies 111 or the wafer 20. The area occupied by the recesses 117A may range from about 60% to about 20% of the area of the back surface 111B of the substrate SUB. The recesses 117A may be formed on the back surface 111B of the substrate SUB without significantly decreasing structural strength of the semiconductor dies 111 or the wafer 20.

In some embodiments, after the conductive pillars 114 are formed, a protection layer 115 is formed on the passivation layer 113 so as to cover the conductive pillars 114. In some embodiments, the protection layer 115 may be a polymer layer having sufficient thickness to encapsulate and protect the conductive pillars 114. For example, the protection layer 115 may be a polybenzoxazole (PBO) layer, a polyimide (PI) layer or other suitable polymers. In some alternative embodiments, the protection layer 115 may be made of inorganic materials.

Figure 2:
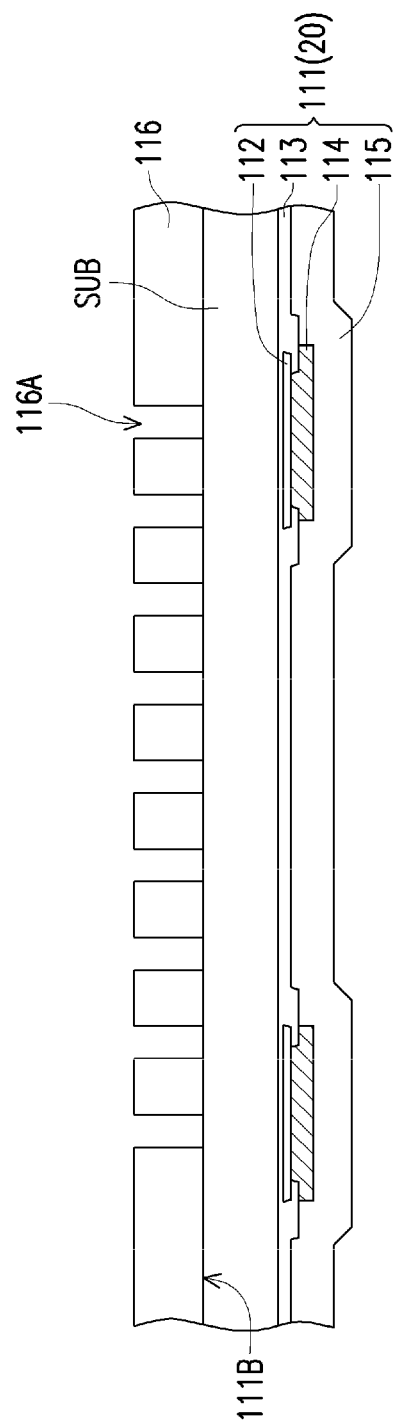

Referring to FIG. 2, the wafer 20 is flipped upside down. A patterned mask layer 116 formed on the back surface 111B of semiconductor dies 111 or the wafer 20 may include a plurality of openings 116A which expose portions of the back surface 111B. In some embodiments, the patterned mask layer 116 may be formed of silicon nitride, titanium nitride, or the like. In some embodiments, the patterned mask layer 116 is formed, for example, by Low-Pressure Chemical Vapor Deposition (LPCVD). In other embodiments, the patterned mask layer 116 is formed by thermal nitridation of silicon, Plasma Enhanced Chemical Vapor Deposition (PECVD), or the like. The patterning process of patterned mask layer 116 is described in detail as followings. A photoresist layer is formed on the back surface 111B of the semiconductor dies 111. A patterned mask layer (not shown) with plurality of openings corresponding to the plurality of openings 116A may be located above the photoresist layer. Once the patterned mask layer is formed, an etching process is performed to form the patterned mask layer 116 using the patterned mask as an etching mask.

Next, in some embodiments, once the patterned mask layer 116 is formed on the back surface 111B of semiconductor dies 111 or the wafer 20, an etching process is performed to form a thermal enhancement pattern 117 shown in FIG. 3. The etching process may include a wet etching process, which may use KOH, Tetra Methyl Ammonium Hydroxide (TMAH), or the like as an etchant. After the the thermal enhancement pattern 117 is formed on the back surface 111B of the semiconductor dies 111, the patterned mask layer 116 is removed from the back surface 111B of the semiconductor dies 111. In some embodiments, the thermal enhancement pattern 117 includes recesses 117A which extend from the back surface 111B of the semiconductor dies 111 into the semiconductor dies 111. As illustrated in FIG. 3, the depth of the recesses 117A is less than the thickness of the semiconductor dies 111 or the wafer 20. For example, the depth of the recesses 117 is about 60% to about 20% of the thickness of the semiconductor dies 111 or the wafer 20. The area occupied by the recesses 117A may range from about 60% to about 20% of the area of the back surface 111B of the semiconductor dies 111. The recesses 117A may be formed on the back surface 111B of the semiconductor dies 111 or the wafer 20 without significantly decreasing structural strength of the semiconductor dies 111 or the wafer 20.

Figure 4:
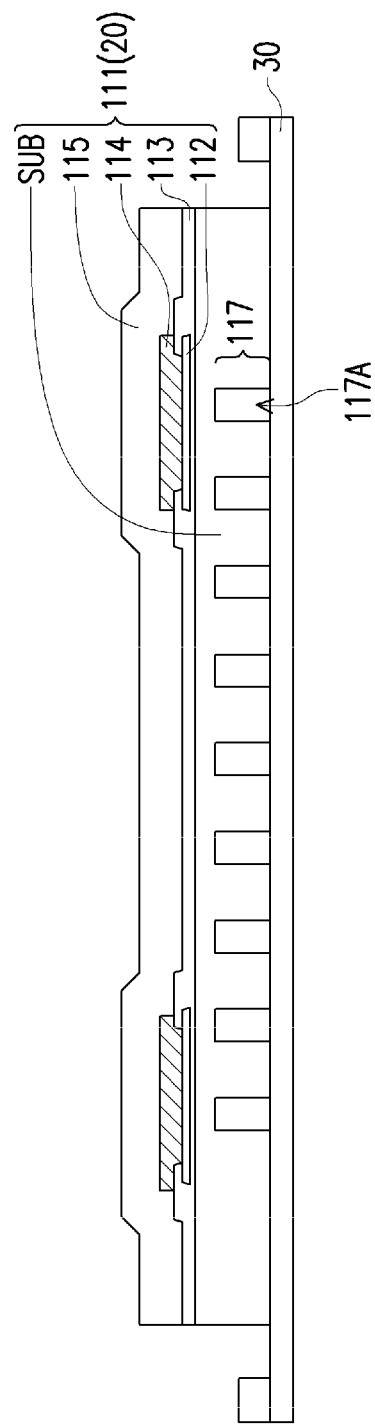

Referring to FIG. 4, after striping the patterned mask layer 116 from the back surface 111B of the semiconductor dies 111, the wafer 20 is flipped upside down and placed onto a tape 30 such that the back surface 111B of the semiconductor dies 111 or the wafer 20 adheres with the tape 30. In some embodiments, the tape 30 may support the wafer 20 mounted thereon and temporarily adhere with the back surface 111B of the wafer 20. After mounting the wafer 20 on the tape 30, a wafer dicing process is performed on the wafer 20 such that the semiconductor dies 111 are singulated. After performing the singulation process, a plurality of singulated semiconductor dies 111 temporarily adhered with the tape 30 are formed. As shown in FIG. 4, each of the singulated semiconductor dies 111 includes the connection pads 112, a passivation layer 113, the conductive pillars 114, and the protection layer 115. The semiconductor dies 111 may be singulated into the desired shape such as rectangular shape for the subsequent packaging processes.

Moreover, during the wafer dicing process, the protection layer 115 may well protect the conductive pillars 114 of the singulated semiconductor dies 111. In addition, the conductive pillars 114 of the singulated semiconductor dies 111 may be protected from being damaged by subsequently performed processes, such as the pick-and-place process of the singulated semiconductor dies 111, the molding process, and so on.

In some alternative embodiments, the wafer 20 temporarily adhered with the tape 30 may not be singulated into the plurality of singulated semiconductor dies 111 and may have a round shape (not shown). The wafer 20 may be packed by the subsequently performed processes as illustrated in FIG. 6 through FIG. 10.

Figure 5B:
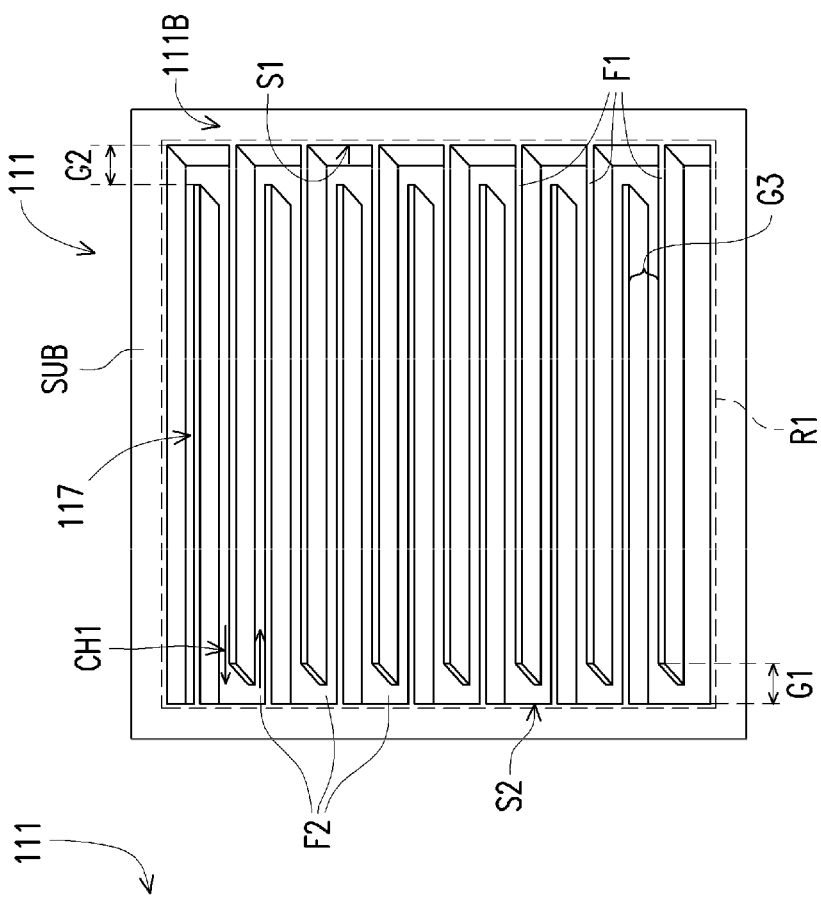
FIG. 5A through 5C illustrate the back surface of the singulated semiconductor die in accordance with some embodiments of the present disclosure.
Figure 5A:
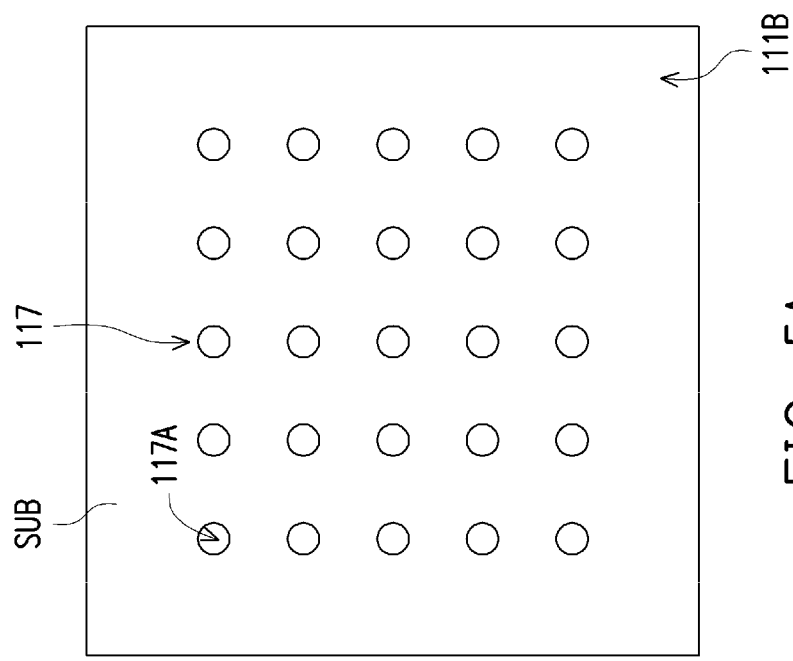
Figure 5C:
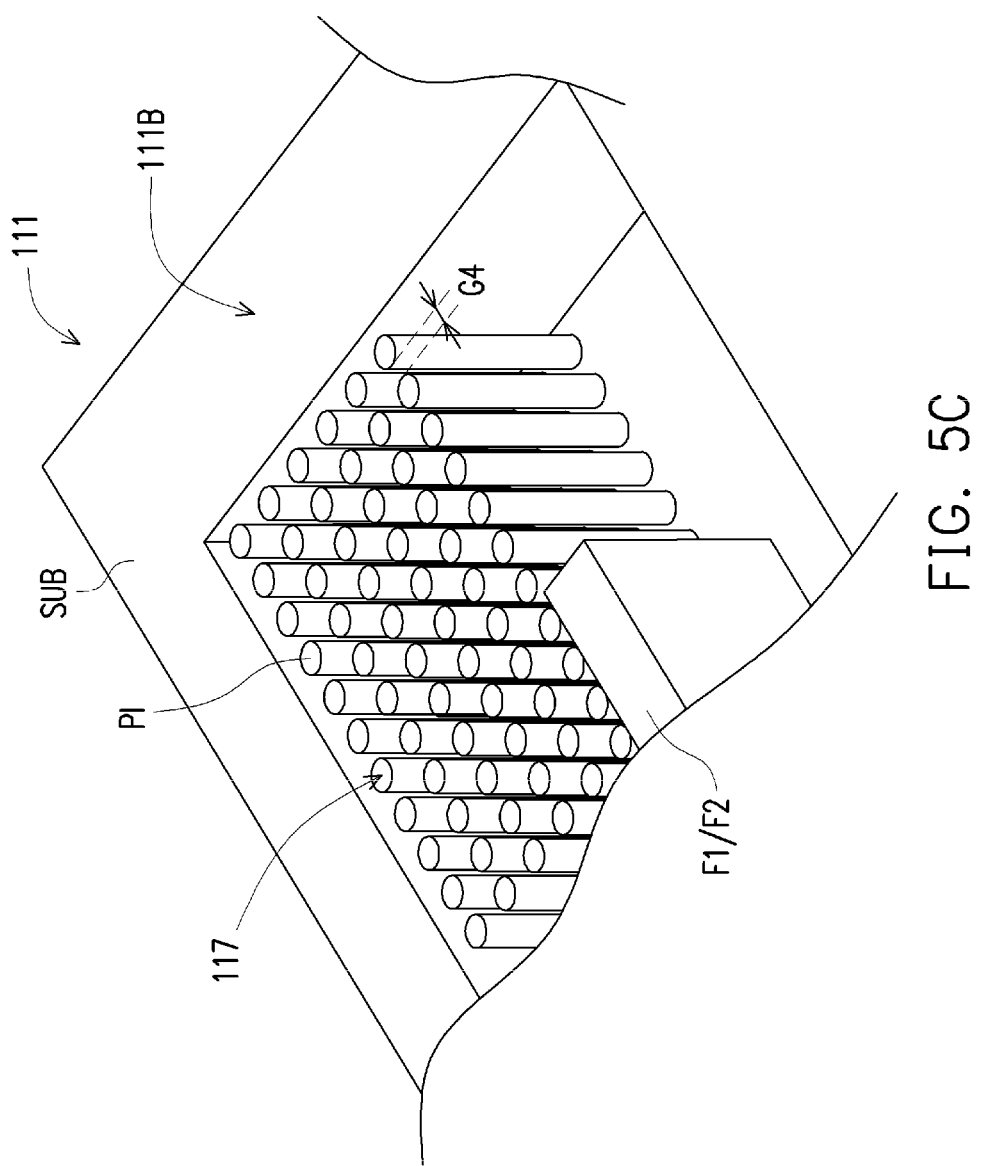

FIG. 5A through 5C illustrate the back surface 111B of the singulated semiconductor die 111, showing the thermal enhancement pattern 117 etched into the back surface 111B of a single semiconductor die 111. In some embodiments, where wafer 20 is not singulated, the back surface of the wafer may have a single thermal enhancement patterns 117 shown in any of FIG. 5A through 5C etch into the back surface of the water 20 (not shown). In alternative embodiments, thermal enhancement pattern 117 shown FIG. 5A through 5C may be etch in regions corresponding to each of the semiconductor die 111 in the non-singulated wafer 20, resulting in the back surface of the wafer 20 having an array of thermal enhancement patterns 117 (not shown).

As illustrated in FIG. 5A, the thermal enhancement pattern 117 is an array of recess 117a in the form of holes that are formed into back surface 111B of the semiconductor die 111. Referring to FIG. 5B, in some embodiments, the thermal enhancement pattern 117 includes a set of first fins F1 and a set of second fins F2 protruding from a bottom of recessed region R1. The first fins F1 and second fins F2 may be substantially parallel to each other. In some embodiments, the set of first fins F1 may be connected to a first sidewall S1 of the recessed region R1 and separated from a second sidewall S2 of the recessed region R1, which is opposite the first sidewall S1, by a gap G1; and the set of second fins F2 may be connected to the second sidewall S2 while separated from the first sidewall S1 by a gap G2. Furthermore, the set of first fins F1 and the set of second fins F2 may be interleaved, as shown in FIG. 5B, and spaced apart from immediately adjacent fins by a gap G3, such that a meandering flow channel CH1 is defined. See, for example, arrows in FIG. 5B indicating direction of flow in the flow channel CH1. In an alternative embodiment, the thermal enhancement pattern 117 may include pillars P1 in addition to the fins F1/F2, as shown in FIG. 5C, wherein the pillars P1 may be spaced from one another by a gap G4. In yet another alternative embodiment, the recessed region R1 is free of fins F1/F2 and only the pillars P1 protrude from the bottom of the recessed region R1 (not shown).

During operation, as will be discussed in further detail below, the recesses 117A, fins F1/F2 and/or pillars P1 may serve as the heat dissipation structures that increase the surface area of the semiconductor die 111 or the wafer 20 in contact with the cooling liquid, allowing faster heat dissipation. In certain embodiments, as will be discussed in further detail below, a conductive material is formed on the recesses 117A, fins F1/F2 and/or pillars P1 such that the contact surface of the semiconductor die 111 or the wafer 20 with the conductive material is increased, allowing faster heat dissipation.

In some embodiments, the recessed region R1 may have a depth of between about 10 μm to about 2000 μm. In some embodiments, the fins F1 and F2 may have a height less than or equal to the depth of the recessed region R1. In some embodiment, the dimension of gaps G1, G2 and G3 may be identical and are between about 10 μm to about 2000 μm. In some embodiments, the dimension of gaps G1, G2 and G3 may be different and be in the range described above. In some embodiments, the dimension of gap G4 between pillars may be between about 50 μm to about 500 μm. In some embodiments, the dimension gaps G1, G2, G3 and G4 may be chosen such that a cooling liquid may constantly flow through each of the gaps G1, G2, G3 and G4 during operation.

Figure 6:
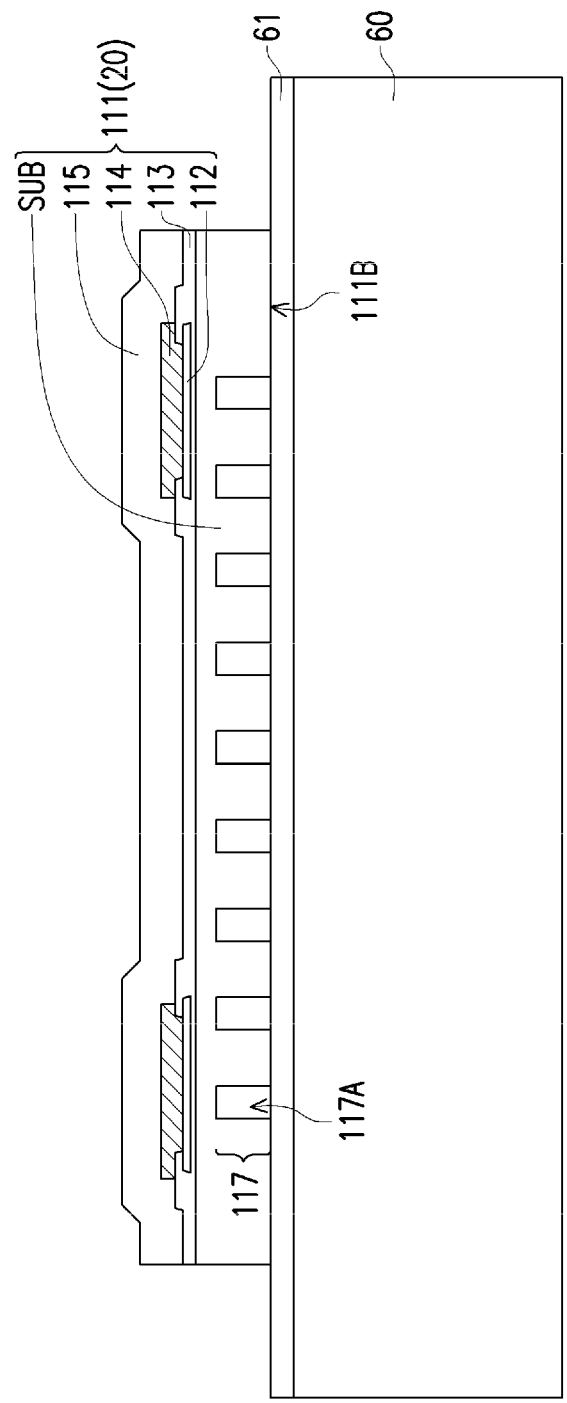

FIG. 6 through 10 illustrates the process flow of forming a chip package 110 including the semiconductor die 111, an insulating encapsulant 118', an adapter 300 and an optional chip package 40. Although shown as a process for forming a single chip package 110, it is not limited thereto. The packaging process may be a wafer-level process whereby multiple chip packages 110 may be formed simultaneously on a wafer carrier. Furthermore, each chip package may include more than one semiconductor die 111 packaged therein, and therefore the number of semiconductor die 111 is not limited to one. Referring to FIG. 6, a carrier 60 having a de-bonding layer 61 formed thereon is provided. In some embodiments, the carrier 60 is a glass substrate and the de-bonding layer 61 is formed on the glass substrate. In some embodiments, the de-bonding layer 61 may include a dielectric material layer made of an epoxy-based thermal-release material, which loses its adhesive property when being heated, such as a light-to-heat-conversion (LTHC) release coating film. In alternative embodiments, the de-bonding layer 61 may include a dielectric material layer made of an ultra-violet (UV) glue, which loses its adhesive property when being exposed to UV lights, for example however, the disclosure is not limited thereto.

In some embodiments, the wafer 20 or at least one of the singulated semiconductor dies 111 singulated from the wafer 20 is picked-up from the tape 30 and placed on the de-bonding layer 61 carried by the carrier 60. For example, the wafer 20 or the singulated semiconductor die 111 is disposed on the de-bonding layer 61 carried by the carrier 60 such that the back surface 111B of the singulated semiconductor die 111 or the wafer 20 is in contact with the de-bonding layer 61 and the thermal enhancement pattern 117 (e.g., the recesses 117A, the recessed region R1) is enclosed by the de-bonding layer 61.

Figure 7:
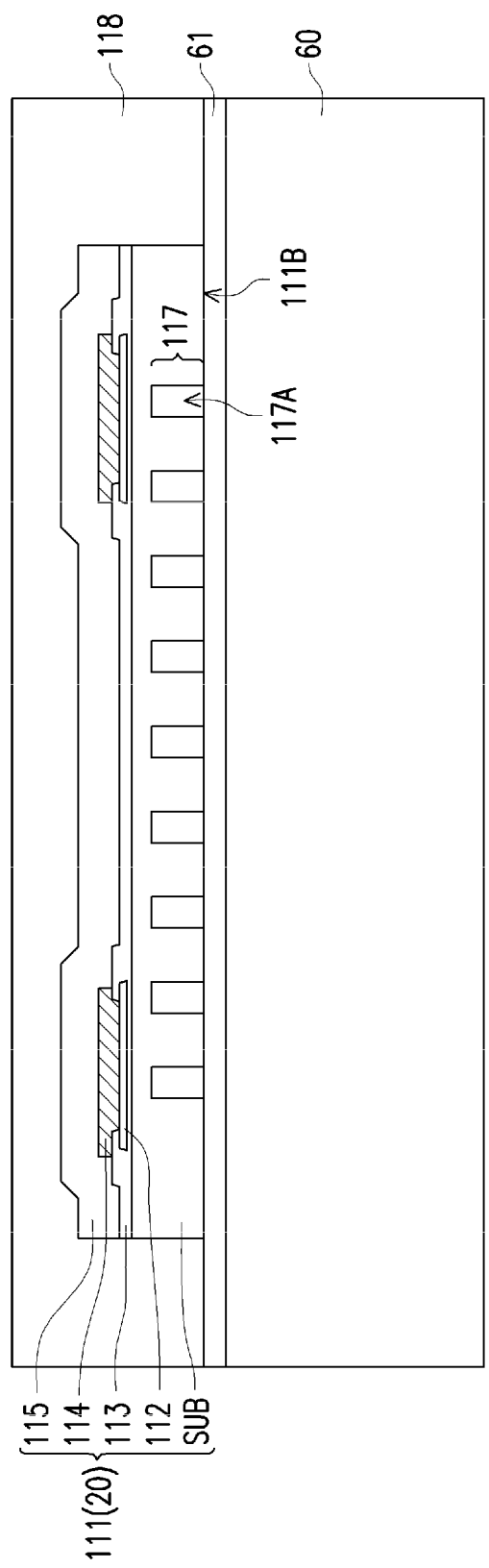

Referring to FIG. 7, an insulating material 118 is formed on the de-bonding layer 61 to cover the at least one of the singulated semiconductor dies 111 or the wafer 20. In some embodiments, the insulating material 118 is a molding compound formed by an over-mold process. The conductive pillars 114 and the protection layer 115 of the singulated semiconductor die 111 or the wafer 20 are covered by the insulating material 118. As illustrated in FIG. 7, the conductive pillars 114 and the protection layer 115 of singulated the semiconductor die 111 are not revealed and are well protected by the insulating material 118. In some embodiments, the insulating material 118 includes epoxy resin or other suitable dielectric materials.

Figure 8:
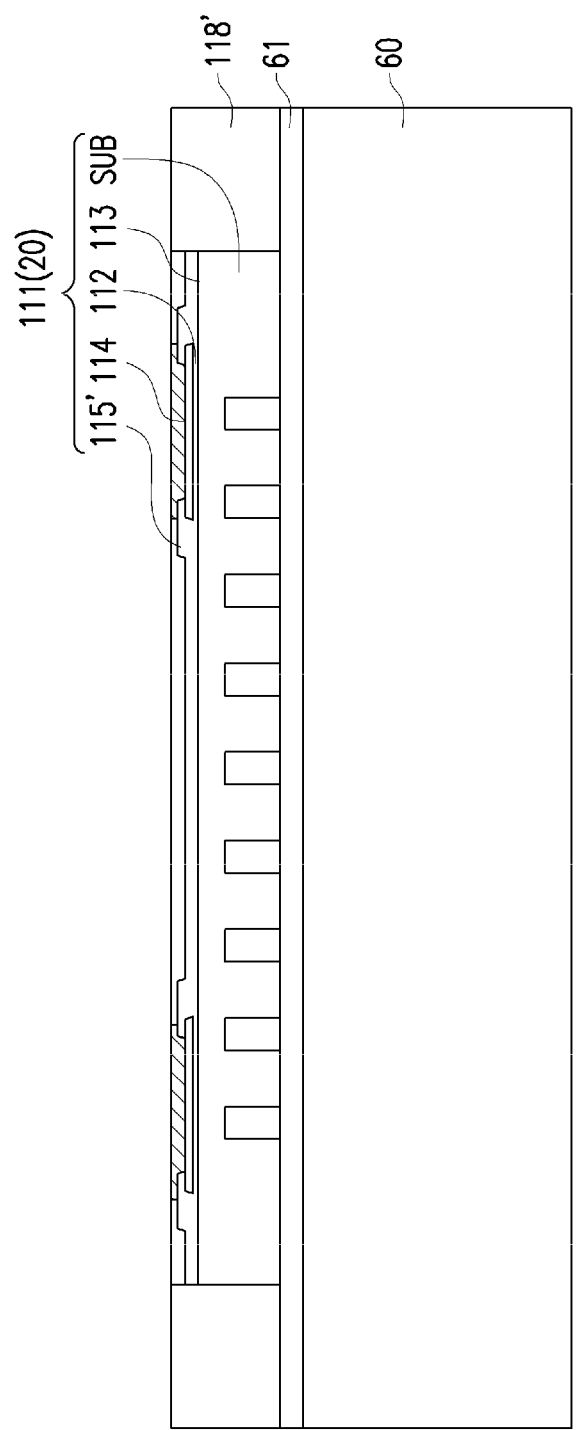

Referring to FIG. 8, the insulating material 118 is then ground until the top surfaces of the conductive pillars 114 and the top surface of the protection layer 115 are exposed. In some embodiments, the insulating material 118 is ground by a mechanical grinding process, a chemical mechanical polishing (CMP) process or combinations thereof. After the insulating material 118 is ground, the remaining insulating encapsulant 118' laterally encapsulates the singulated semiconductor die 111 or the wafer 20. In other words, the insulating encapsulant 118' is in contact with and surrounds sidewalls of the singulated semiconductor die 111 or the wafer 20. During the grinding process of the insulating material 118, portions of the protection layer 115 are ground to reveal the conductive pillars 114 and the remaining protection layer 115' laterally encapsulates the conductive pillars 114. In some embodiments, after the forming of the insulating encapsulant 118' and the protection layer 115', the top surface of the insulating encapsulant 118', the top surfaces of the conductive pillars 114 and the top surface of the protection layer 115' are substantially at the same level.

Figure 9:
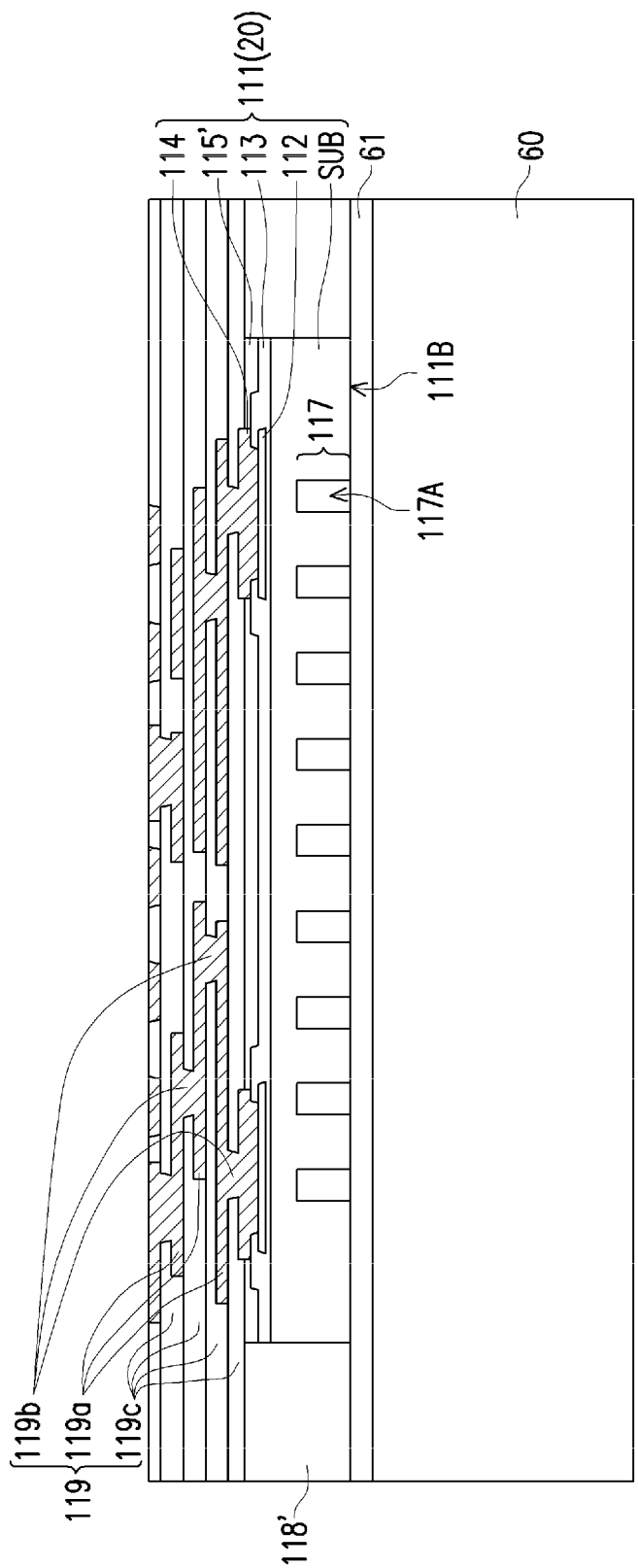

Referring to FIG. 9, after the insulating encapsulant 118' and the protection layer 115' are formed, a redistribution circuit structure 119 electrically connected to the conductive pillars 114 of the singulated semiconductor die 111 or the wafer 20 is formed on the top surfaces of the top surface of the insulating encapsulant 118', the top surfaces of the conductive pillars 114, and the top surface of the protection layer 115'. The redistribution circuit structure 119 may include a plurality of redistribution wirings 119a, a plurality of vias 119b, and a plurality of patterned dielectric layers 119c, as shown in FIG. 9. The redistribution wirings 119a and the patterned dielectric layers 119c are stacked alternately, and the vias 119b are embedded in and penetrate the patterned dielectric layers 119c to electrically connect the redistribution wirings 119a. For example, the redistribution wirings 119a and a plurality of vias 119b may be copper wirings and copper vias, and the material of the patterned dielectric layers 119c may include polyimide (PI), polybenzoxazole (PBO) or other suitable dielectric polymer. In some embodiments, the material of the patterned dielectric layers 119c may be the same material as the protection layer 115'.

Figure 10:
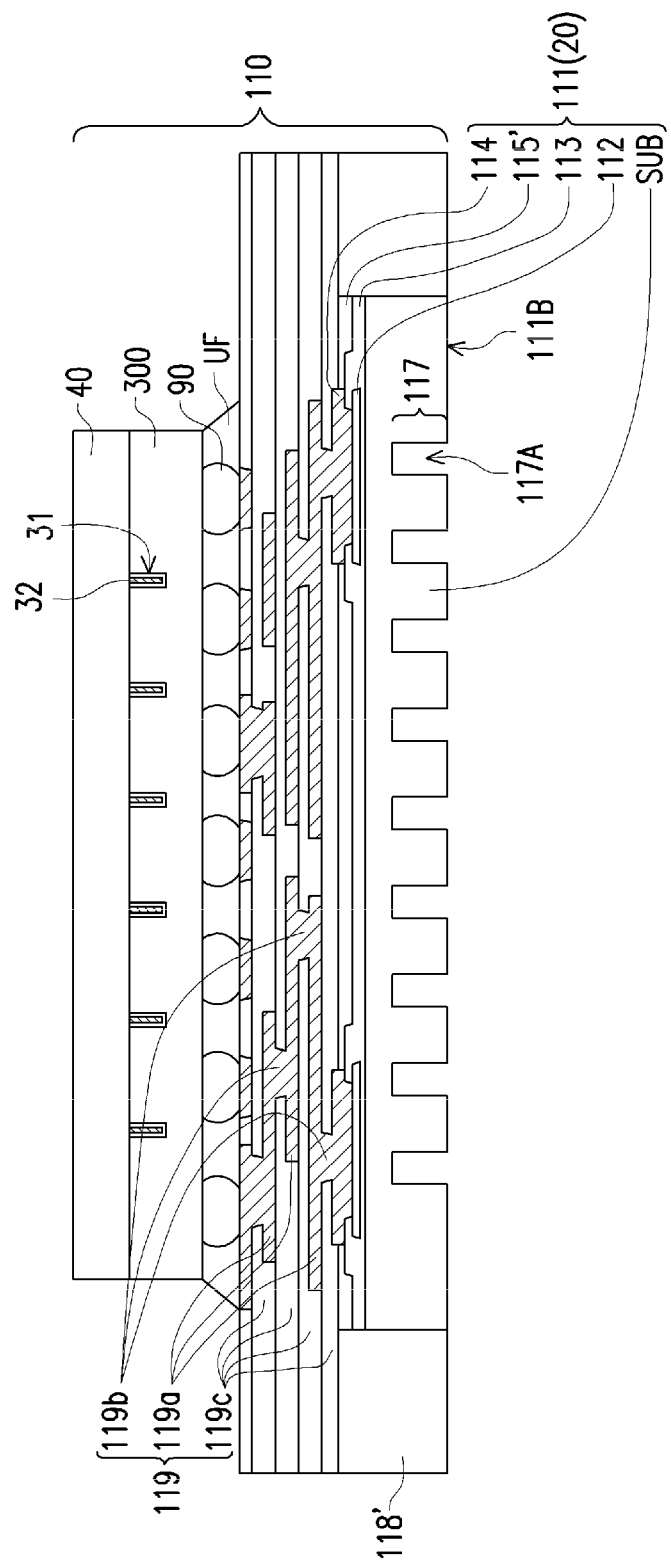

Referring to FIG. 10, an adapter 300 is attached on the redistribution circuit structure 119. In detail, the conductive bumps 90 of the adapter 300 are bonded to the redistribution wirings 119a that are exposed at the top surface of the redistribution circuit structure 119. For example, the conductive bumps BP may be micro-bumps, controlled collapse chip connection (C4) bumps or the like. The adapter 300 may be any adapter that has circuit wirings which are used to electrically connect the semiconductor die 111 to another device (e.g. chip package 40 discussed below) that may be attached to the adapter 300. In some embodiments, the adapter 300 may be a female adapter having a plurality of insertion holes 31 on the top surface. A terminal (not shown) electrically connected to the circuit wirings of the adapter 300 may reside in each of the insertion holes 31. The redistribution circuit structure 119, insulating encapsulant 118', semiconductor die 111 and the adapter 300 may collectively be referred to as chip package 110 hereafter.

After the adapter 300 is bonded to the redistribution circuit structure 119, an underfill UF is formed in the gap between the redistribution circuit structure 119 and the overlying adapter 300, and is cured. The underfill UF may be a polymer, an epoxy, a resin or the like. The underfill UF serves as stress buffer to minimize fatigue of the conductive bumps BP due to coefficient of thermal expansion (CTE) mismatch between the adapter and the redistribution circuit structure 119.

After the formation of the underfill UF, a chip package 40 having a plurality of connection pins 32 corresponding to the insertion holes 31 may be mounted to the adapter 300. The chip package 40 mounted on the adapter 300 electrically connects to the semiconductor die 111 through the connection pins 32, adapter 300 and the redistribution circuit structure 119. The connection of chip package 40 to the adapter 300 through connection pins 32 and insertion holes 31 is a detachable connection, and allows chip package 40 to be easily replaced by other chip packages. In some embodiments, the chip package 40 may be a memory package such as dynamic random access memory (DRAM), static random access memory (SRAM) die, and the like. In some embodiments, chip package 40 is only mounted on the adapter 300 after the processes described below with reference to FIG. 11 through 19 and FIG. 21 are performed.

In some embodiments, the adapter 300 does not include the plurality of insertion holes 31 but includes a plurality of connection pads (not shown) formed thereon. In this case, the chip package 40 may be physically and electrically connected to the connection pads of the adapter 300 through solder. By providing the adapter 300 being connected to the chip package 40 through solder, the chip package 40 may be de-bonded from the adapter 300 (i.e. disconnected from chip package 110) without damaging the redistribution circuit structure 119. In an alternative embodiment, the adapter 300 may be an interposer substrate having sockets formed thereon or therein.

Subsequently, the de-bonding layer 61 and the carrier 60 is de-bonded from the chip package 110 such that the back surface 111B of the semiconductor die 111 or the wafer 20, the bottom surface of the insulating encapsulant 118' opposite to the top surface of the insulating encapsulant 118' are de-bonded from the carrier 60 and are thus revealed. After de-bonding, the back surface 111B of the semiconductor die 111 and the thermal enhancement pattern 117 (e.g., the recesses 117A, the recessed region R1) formed thereon are revealed. The bottom surface of the insulating encapsulant 118' and the back surface 111B of the semiconductor die 111 or the wafer 20 are substantially at the same level after de-bonding. In some embodiments, the external energy such as UV laser, visible light or heat, may be applied to the de-bonding layer 61 such that the chip package 110 and the de-bonding layer 61 carried by the carrier 60 can be separated from each other.

Figure 11:
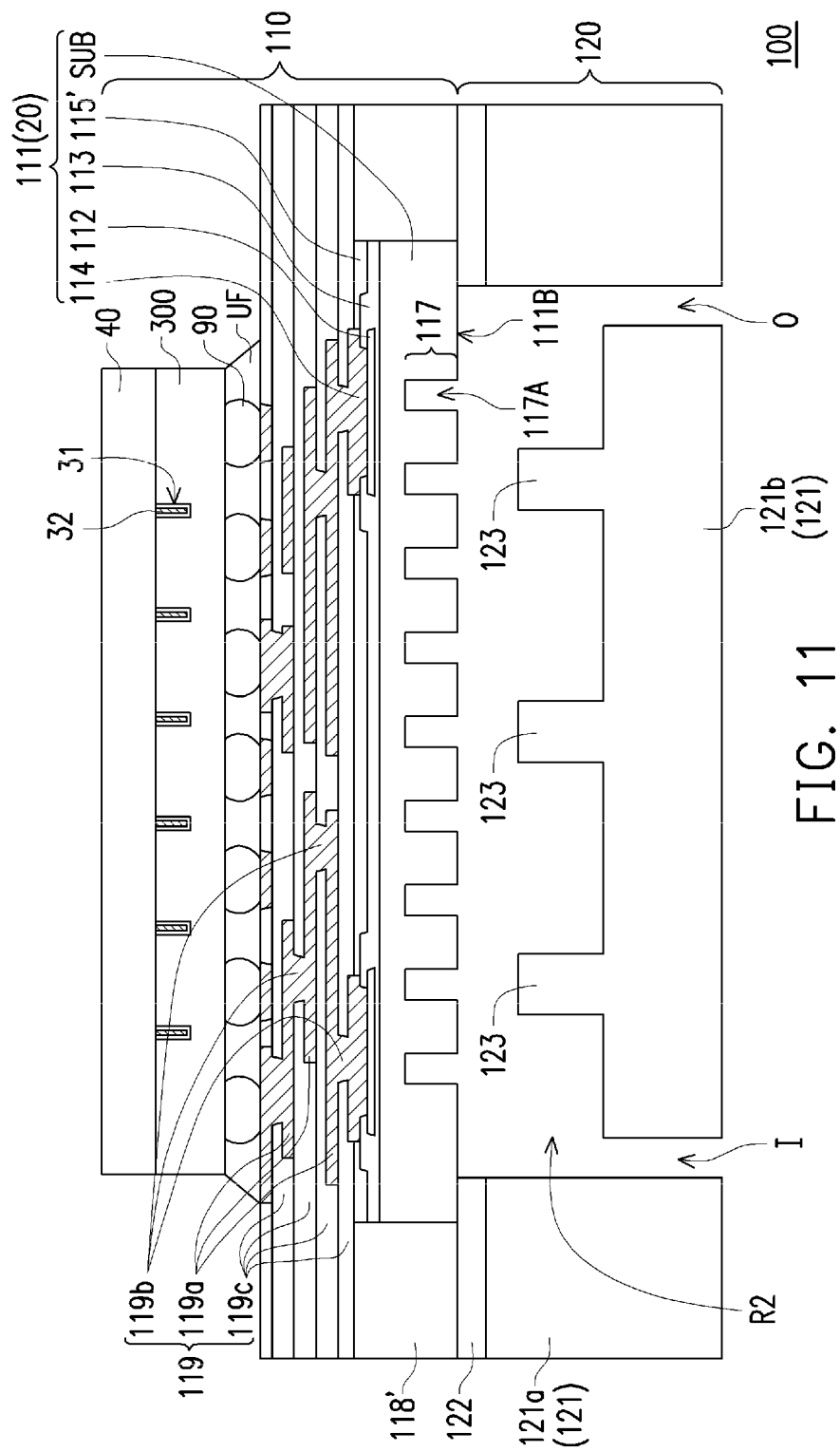

Referring to FIG. 11, the chip package 110 is disposed over and assembled with a first heat dissipation structure 120 which includes a heat spreader 121 and a first sealing member 122. The chip package 110 is assembled with side wall 121a of the heat spreader 121 through the first sealing member 122. As illustrated in FIG. 11, the first sealing member 122 is disposed between the chip package 110 and the side wall 121a of the heat spreader 121. Both the chip package 110 and the side wall 121a of the heat spreader 121 are in contact with the first sealing member 122. In some embodiments, an inner side surface of the first sealing member 122 and an inner side surface of the side wall 121a of the heat spreader 121 are substantially aligned with each other in vertical direction. Furthermore, in some embodiments, an side surface of the semiconductor die 111 or the wafer 20 is not aligned with the inner side surfaces of the side wall 121a and the first sealing member 122 such that the interface between the insulating encapsulant 118' and the semiconductor die 111 (or the wafer 20) may be protected by the first sealing member 122 from delamination. The first sealing member 122 not only provides sealing function but also serves as stress buffer between the chip package 110 and the side wall 121a of the heat spreader 121. The first sealing member 122 may prevent the chip package 110 from directly in contact with the side wall 121a of the heat spreader 121 to increase assembly yield rates of the first heat dissipation structure 120.

The heat spreader 121 has a recess R2 surrounded by the side wall 121a and bottom plate 121b of the heat spreader 121. In some embodiments, the recess R2 is corresponding to the thermal enhancement pattern 117 on the back surface 111B of the semiconductor die 111 or the wafer 20. The first sealing member 122 disposed on the back surface 111B of the semiconductor die 111 or the wafer 20 and the bottom surface of the insulating encapsulant 118' may expose the thermal enhancement pattern 117. Therefore, after assembling the chip package 110, the first sealing member 122 and the heat spreader 121, the recess R2 is capped or enclosed by the back surface 111B of the semiconductor die 111 or the wafer 20 and the recess R2 may serve as flow channel for cooling liquid (e.g., cooling water or other types of coolant). After assembling the chip package 110, the first sealing member 122 and the heat spreader 121, the recess R2 and the recesses 117A (recessed region R1) are communicated with each other, and both the recess R2 and the recesses 117A (recessed region R1) may serve as flow channel for cooling liquid.

In some embodiments, the heat spreader 121 further includes an inlet I and an outlet O communicated with the flow channel, wherein the inlet I and the outlet O penetrate through the bottom plate 121b of the heat spreader 121. The cooling liquid may be applied and flow into the flow channel (e.g., the recess R2 and the recesses 117A) from the inlet I and may flow out from the outlet O. The material of the first sealing member 122 may include organic adhesive such as polybutylacrylate (PBA) or other suitable sealants. In some embodiments, the first sealing member 122 may not only cover the bottom surface of the insulating encapsulant 118', but also partially cover the back surface 111B of the semiconductor die 111 or the wafer 20. However, the distribution of the first sealing member 122 is not limited in the present disclosure. The material of the heat spreader 121 may be high thermal conductivity material such as copper, aluminum, steel, the combination thereof and so on. In some embodiments, the inlet I and the outlet O formed on the heat spreader 121 may be machined using a laser drill, a mechanical drill or the like.

Moreover, in some embodiments, the heat spreader 121 includes thermal enhancement protrusions 123 formed on an inner top surface of the bottom plate 121b. The thermal enhancement protrusions 123 protrude from the inner top surface of the bottom plate 121b toward the back surface 111B of the semiconductor die 111 or the wafer 20. Furthermore, the thermal enhancement protrusions 123 extend into the recess R2 between the bottom plate 121b and the semiconductor die 111 or the wafer 20. In certain embodiments, the thermal enhancement protrusions 123 and the thermal enhancement pattern 117 faces. In some embodiments, as illustrated in FIG. 11, the thermal enhancement protrusions 123 are not in contact with the back surface 111B of the semiconductor die 111 such that a gap is formed between the thermal enhancement protrusions 123 and the back surface 111B of the semiconductor die 111 or the wafer 20. In certain embodiments, the thermal enhancement protrusions 123 may generate turbulence of the cooling liquid when the cooling liquid flows in the recess R2 so as to further enhance the ability of heat dissipation of the heat spreader 121. Meanwhile, the thermal enhancement pattern 117 (e.g., the recesses 117A) formed on the back surface 111B of the semiconductor dies 111 or the wafer 20 increases the contact area between the semiconductor die 111 and cooling liquid such that the heat dissipation ability of the heat spreader 121 is enhanced. Moreover, the first sealing member 122 serves as a sealant to prevent the cooling liquid from leaking.

FIG. 12 to FIG. 19 are schematic cross-sectional views of alternative embodiments of a semiconductor device according to some exemplary embodiments of the present disclosure.

Figure 12:
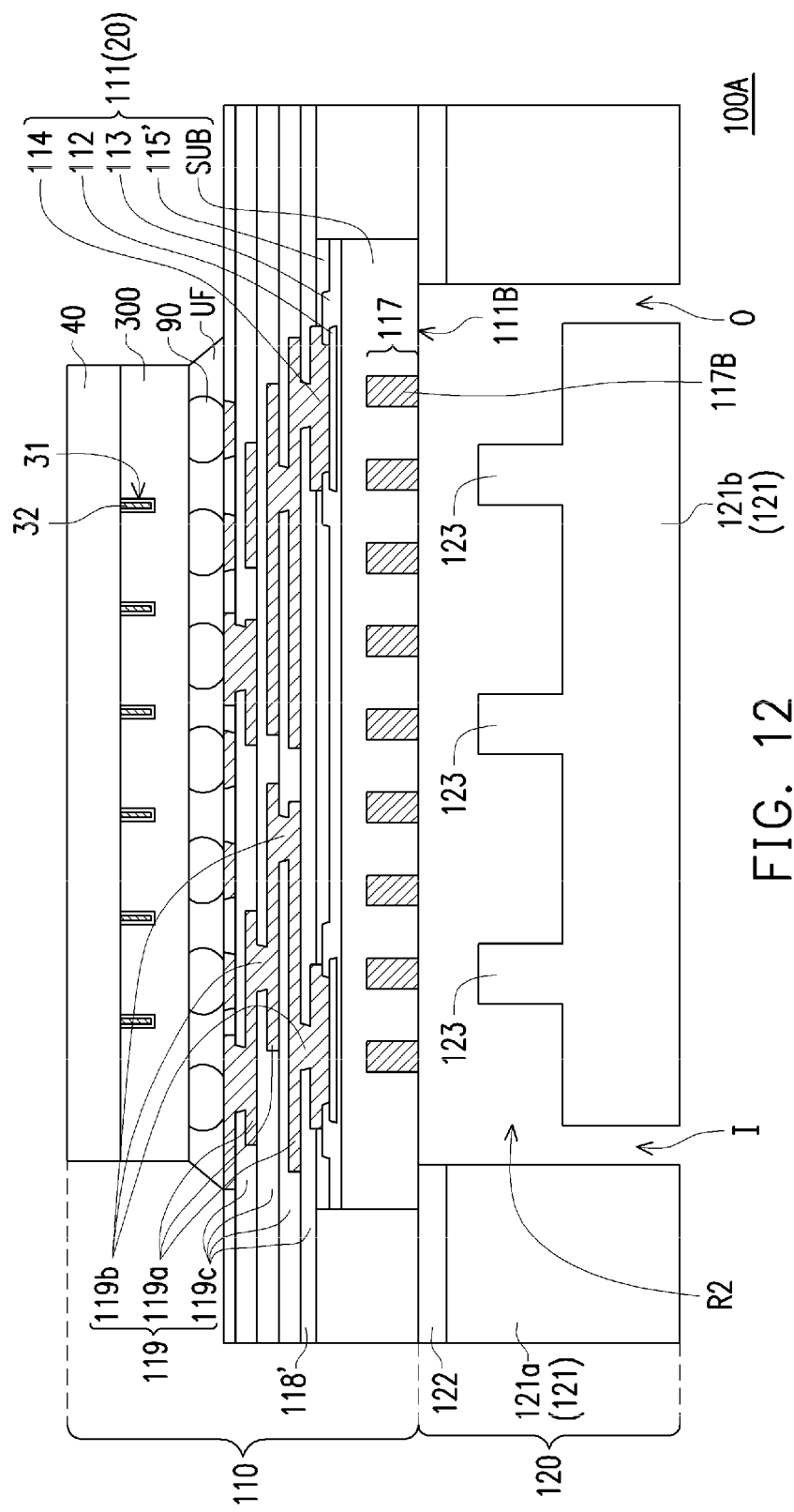
FIG. 12 through 19 illustrate alternative embodiments of the semiconductor device in accordance with some embodiments of the present disclosure.

Referring to FIG. 12, in the semiconductor device 100A, the thermal enhancement pattern 117 (e.g., the recesses 117A) may be filled with the conductive material 117B (e.g., thermal conductive posts) to enhance the ability of heat dissipation. In some alternative embodiments, after the patterned mask layer 116 is removed from the back surface 111B of the semiconductor die 111 or the wafer 20 as shown in FIG. 3, the conductive material 117B is embedded in the recesses 117A of the thermal enhancement pattern 117. In some embodiments, the conductive material 117B may be formed by sputtering of a seed layer on the back surface 111B of the semiconductor die 111 or the wafer 20. In some embodiments, the seed layer may be a metal layer with high thermal conductivity, which may be a single layer or a composite layer including a plurality of sub-layers formed of different materials. In some embodiments, the seed layer includes a titanium layer and a copper layer over the titanium layer. The seed layer may be formed using, for example, PVD or the like.

Once the seed layer is deposited, the process of developing the photoresist on the back surface 111B of the semiconductor die 111 or the wafer 20 may be performed. Then, conductive materials, is plated on the portions of the seed layer which are not covered by the patterned photoresist to fill the recesses 117A. Subsequently, patterned photoresist may be stripped and the seed layer and the conductive materials may be ground or polished by a CMP process until the portion of the back surface 111B of the semiconductor die 111 or the wafer 20 is exposed. However, the forming of the conductive material 117B is not limited in the present disclosure. In certain embodiments, the conductive material 117B may be copper or other suitable material with high thermal conductivity. Because of the high thermal conductivity, the conductive material 117B may further enhance the ability of heat dissipation. In certain embodiments, the exposed surface of the conductive material 117B and the back surface 111B of the semiconductor die 111 or the wafer 20 are substantially at the same level, and the gap may be formed between the thermal enhancement protrusions 123 and the back surface 111B of the semiconductor die 111 or the wafer 20.

Figure 13:
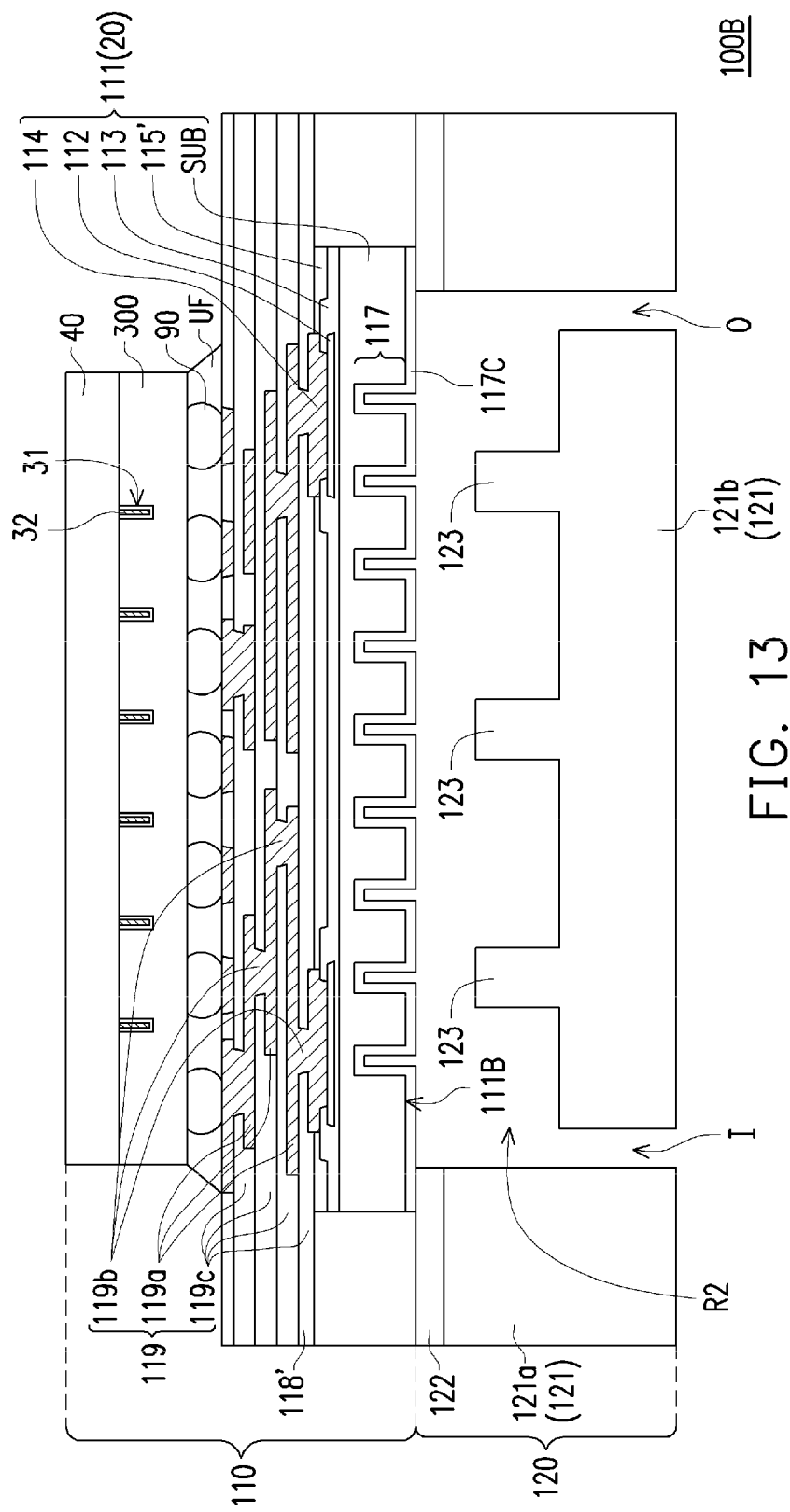

Referring to FIG. 13, in some alternative embodiments, after the patterned mask layer 116 is removed from the back surface 111B of the semiconductor die 111 or the wafer 20 as shown in FIG. 3, the conductive material 117C may be blanket deposited over the back surface 111B of the substrate SUB of the semiconductor die 111 or the wafer 20. The conductive material 117C may include one or more layers of copper, gold, a combination thereof, or other suitable material with high thermal conductivity, and may be formed by ALD, PVD, CVD, a combination thereof, or the like. In certain embodiments, the conductive material 117C may be formed conformally and includes a first conductive portion located inside the thermal enhancement pattern 117 and a second conductive portion located outside the thermal enhancement pattern 117. For example, the first portion of the conductive material 117C at least partially fills the recesses 117A and the second portion of the conductive material 117C formed on the back surface 111B of the semiconductor die 111 or the wafer 20. In some embodiments, the conductive material 117C may partially or fully cover the back surface 111B of the semiconductor die 111 or the wafer 20 except the region of the thermal enhancement pattern 117 (e.g., the recesses 117A). In certain embodiments, the thermal enhancement pattern 117 (e.g., the recesses 117A) may be partially or fully filled with the conductive material 117C. In certain embodiments, when the semiconductor device 100B operates, the conductive material 117C may increase the contact area of the semiconductor die 111 or the wafer 20 and the cooling liquid in a limited region. In certain embodiments, the gap may be formed between the thermal enhancement protrusions 123 and the conductive material 117C such that the cooling liquid flows in the recess R2 so as to further enhance the ability of heat dissipation of the heat spreader 121.

Figure 14:
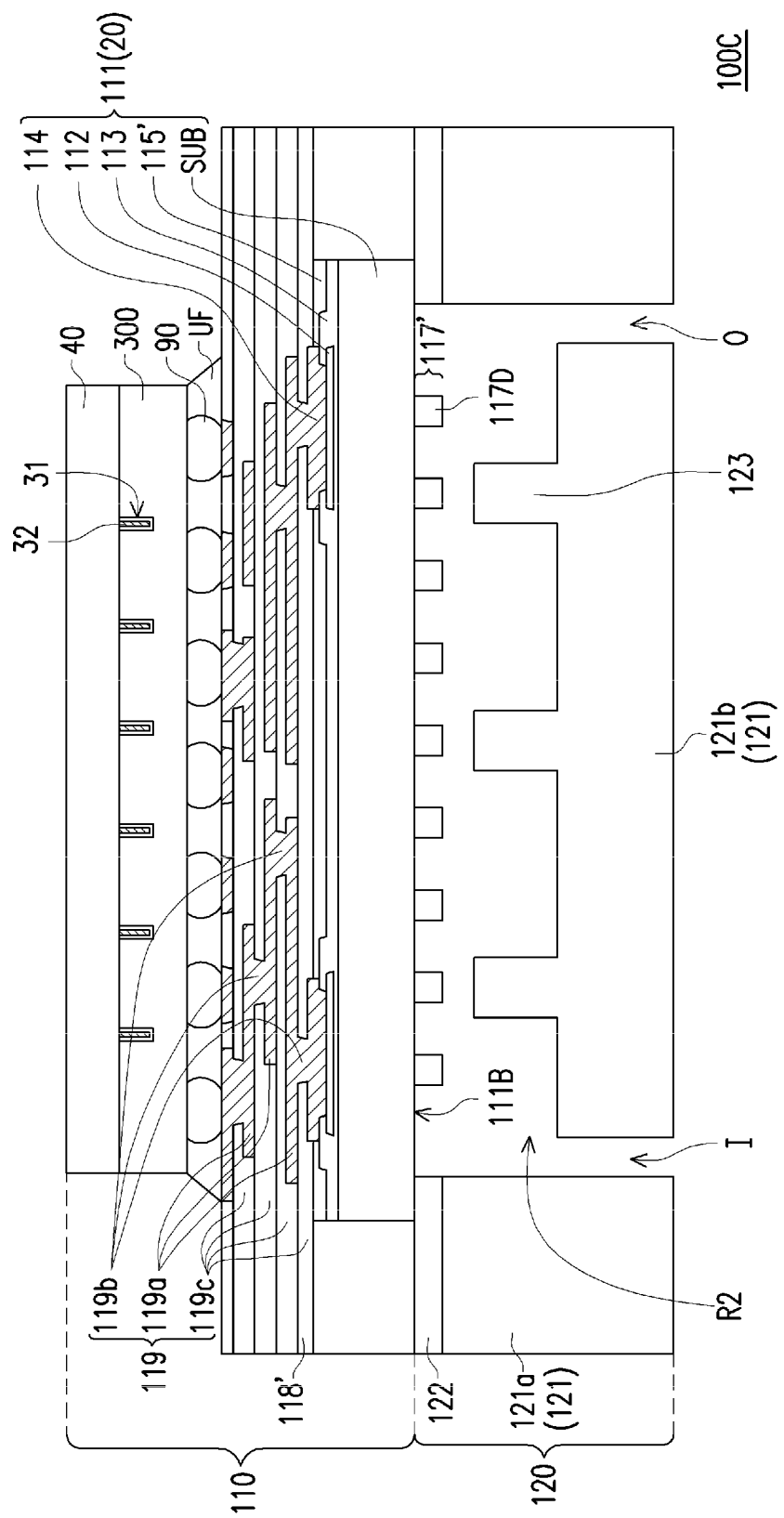

Referring to FIG. 14, in some alternative embodiments, rather than performing the etching process to form the thermal enhancement pattern 117 (e.g., the recesses 117A) as shown in FIG. 3, the thermal enhancement pattern 117' may be formed over the back surface 111B of the substrate SUB of the semiconductor die 111 or the wafer 20. In certain embodiments, the thermal enhancement pattern 117' includes conductive protrusions 117D protruding outwardly from the back surface 111B of the semiconductor die 111 or the wafer 20. The steps for forming the thermal enhancement pattern 117' are described by following description.

A seed layer may be formed over the back surface 111B of the semiconductor die 111 or the wafer 20. In some embodiments, the seed layer may be a metal layer with high thermal conductivity, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist (not shown) is then formed and patterned on the seed layer. The photoresist may be formed by spin coating or the like and may be exposed to the light for patterning. The patterned photoresist corresponds to the desired thermal enhancement pattern 117'. Then, an electro-plating process may be performed to form the conductive protrusions 117D on the seed layer exposed by the patterned photoresist. The conductive protrusions 117D may include a metal, like copper, gold, a combination thereof, or other suitable material with high thermal conductivity.

Once the conductive protrusions 117D has been formed, the patterned photoresist and the portions of the seed layer on which the conductive protrusions 117D is not formed may be removed. The patterned photoresist may be removed by an acceptable ashing or stripping process, such as using an oxygen plasma or the like. In some embodiments, once the patterned photoresist has been removed, exposed portions of the seed layer are removed by using an acceptable etching process, such as wet or dry etching. Thus, the remaining portions of the seed layer and conductive material may together form the thermal enhancement pattern 117' (e.g., the conductive protrusions 117D). In some embodiments, the thermal enhancement pattern 117' protruding from the back surface 111B of the semiconductor die 111 or the wafer 20 may be fin structures that effectively increases the contact area of the semiconductor die 111 or the wafer 20 and the cooling liquid in a limited region. In certain embodiments, the gap may be formed between the thermal enhancement protrusions 123 and the thermal enhancement pattern 117' (e.g., the conductive protrusions 117D) such that the cooling liquid flows in the recess R2 to further enhance the ability of heat dissipation of the heat spreader 121.

Figure 15:
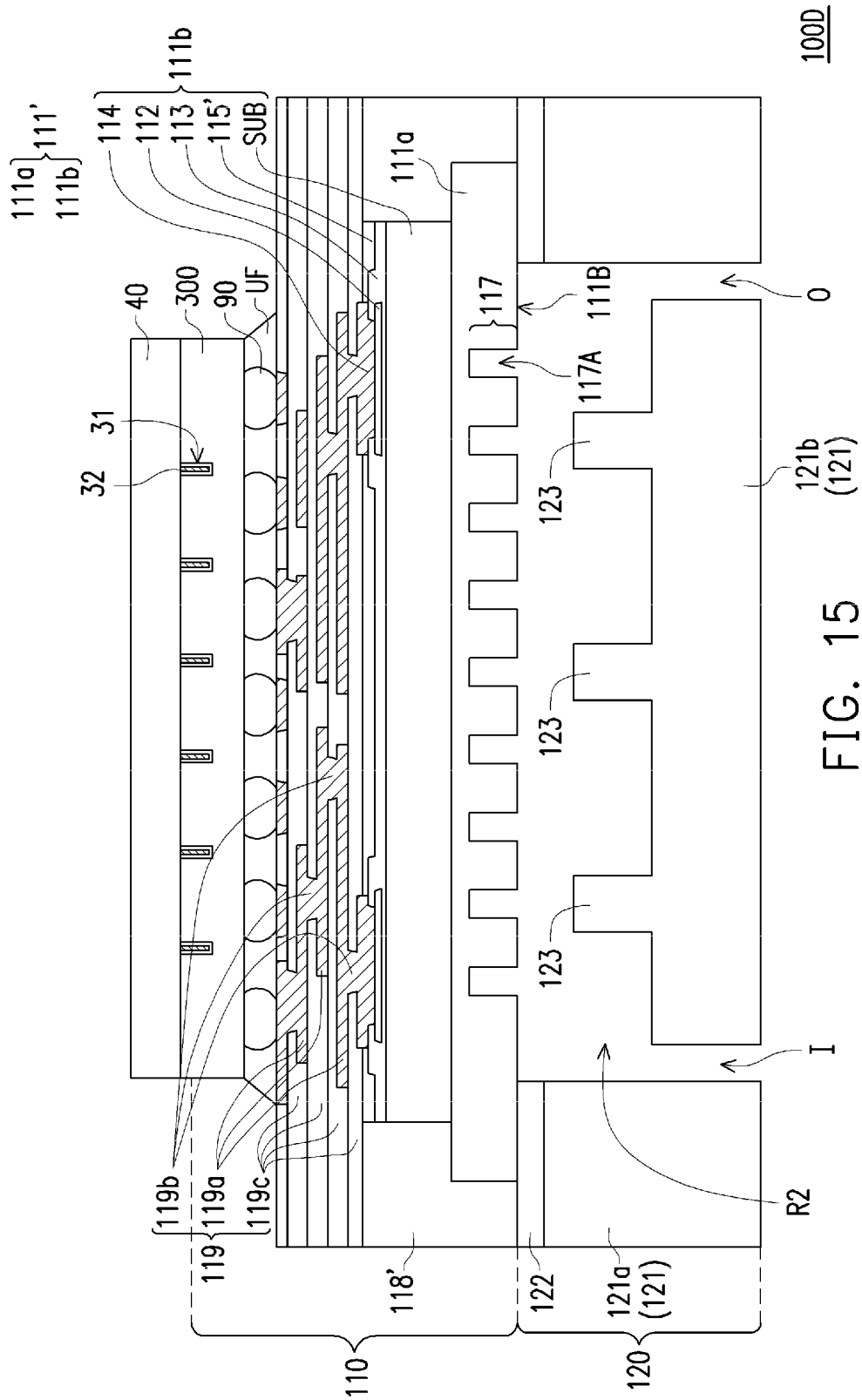

Referring to FIG. 15, in some embodiments, the semiconductor die 111' of the semiconductor device 100D may include a first semiconductor portion 111a and a second semiconductor portion 111b. The second semiconductor portion 111b is disposed on the first semiconductor portion 111a. The thermal enhancement pattern 117 (e.g., the recesses 117A) is formed on the first semiconductor portion 111a. The first semiconductor portion 111a and the second semiconductor portion 111b may or may not be formed by the same material such as the material of the semiconductor die 111 described above. In some embodiments, the second semiconductor portion 111b may be formed by the singulated semiconductor die 111 or the wafer 20 described above. The second semiconductor portion 111b may include the connection pads 112, the passivation layer 113, the conductive pillars 114 and the protection layer 115'. In some embodiments, the first semiconductor portion 111a may be another wafer or another singulated semiconductor dies with or without the functional circuit therein. Then, a chip-to-wafer, a chip-to-chip or a chip-to-wafer bonding technology may be utilized to bond the first semiconductor portion 111a and the second semiconductor portion 111b. In some embodiments, the dimension of the first semiconductor portion 111a is greater than that of the second semiconductor portion 111b. The thermal enhancement pattern 117 (e.g., the recesses 117A) may be formed on the bottom surface of the first semiconductor portion 111a which is away from the second semiconductor portion 111b. Once the first semiconductor portion 111a and the second semiconductor portion 111b are bonded, the procedure referring from FIG. 2 through FIG. 4 and FIG. 6 through FIG. 10 may be performed to package the semiconductor die 111'. In some embodiments, the gap may be formed between the thermal enhancement protrusions 123 and the thermal enhancement pattern 117 (e.g., the recesses 117A) such that the cooling liquid flows in the recess R2 to further enhance the ability of heat dissipation of the heat spreader 121.

Figure 16:
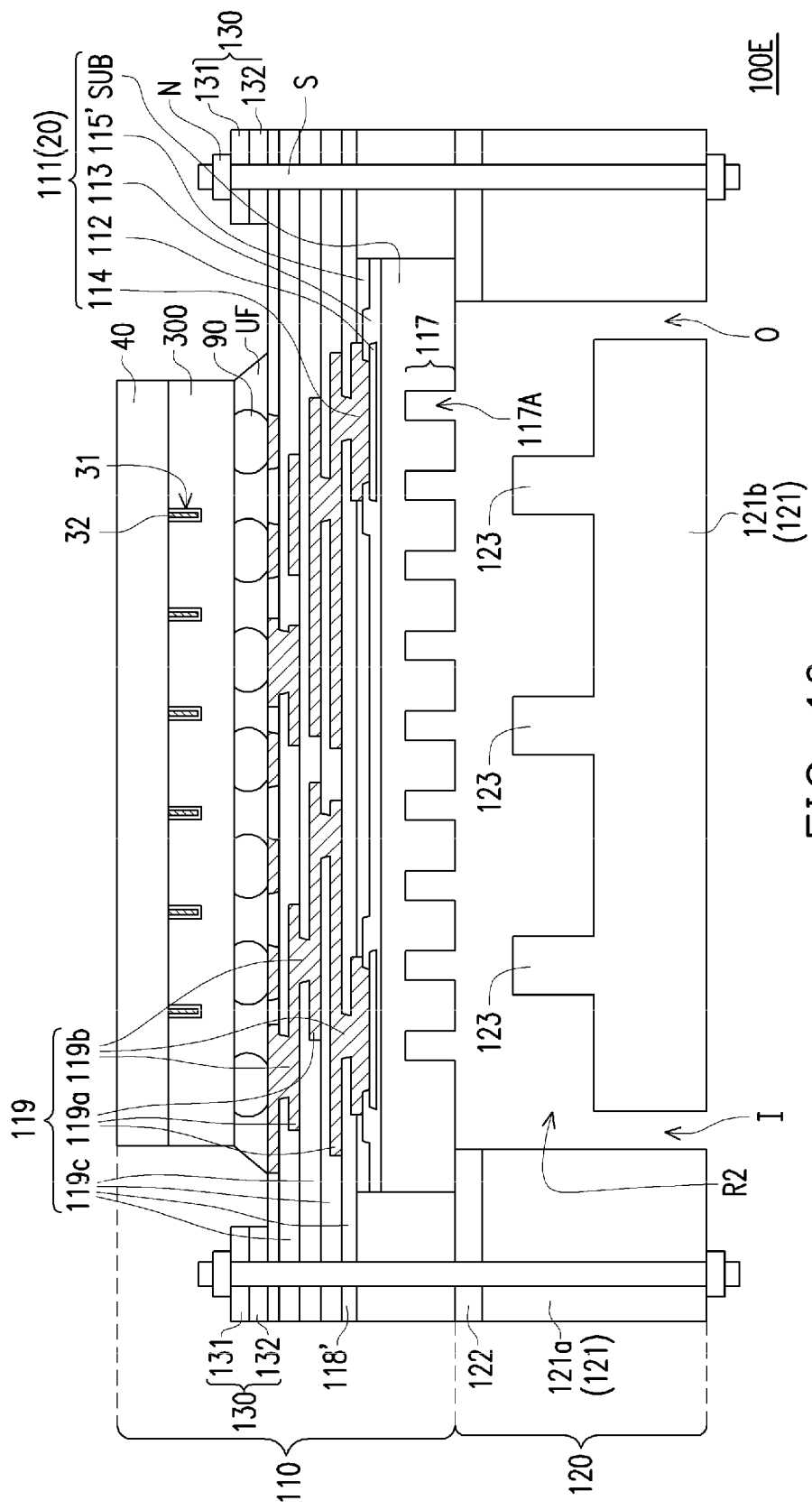

Referring to FIG. 16, in some embodiments, in order to enhance the structural strength of the semiconductor device 100E, after the semiconductor device 100 illustrated in FIG. 10 is formed, a second heat dissipation structure 130 may be further utilized. The second heat dissipation structure 130 may include a heat dissipation portion 131 and a second sealing member 132. The heat dissipation portion 131 may be disposed on a top surface of the chip package 110 opposite to the heat spreader 121. The second sealing member 132 may be disposed between the chip package 110 and the heat dissipation portion 131 such that the first heat dissipation structure 120 and the second heat dissipation structure 130 clamp the chip package 110. The second sealing member 132 serves as stress buffer between the chip package 110 and the heat dissipation portion 130. The second sealing member 132 may prevent the chip package 110 from directly in contact with the heat dissipation portion 131 to increase assembly yield rates of the second heat dissipation structure 130.

Then, one or more screws S are penetrated through the side wall 121a of the first heat dissipation structure 120, the insulating encapsulant 118' of the chip package 110, and the second heat dissipation structure 130. In some embodiment, screw holes may be formed in the chip package 110 and the first heat dissipation structure 120 to accommodate the screws S. Once the one or more screws S penetrates through chip package 110 and the first heat dissipation structure 120, a plurality of nuts N thread in the both ends of the screws S to fasten the semiconductor device 100E. In such way, the chip package 110 may be not easily separate from the first heat dissipation structure 120 and the second heat dissipation structure 130. In certain embodiments, the adapter 300 and chip package 40 on the chip package 110 may be surrounded by and exposed from the second heat dissipation structure 130. The top of the chip package 40 may be higher than the top of the one or more screws S. In certain embodiments, the material of the heat dissipation portion 131 and the second sealing member 132 may be or may not be the same as the heat spreader 121 and the first sealing member 122, respectively. In certain embodiments, the heat dissipation portion 131 formed by the material with high thermal conductivity may further enhance the ability of the heat dissipation of the semiconductor device 100E.

Figure 17:
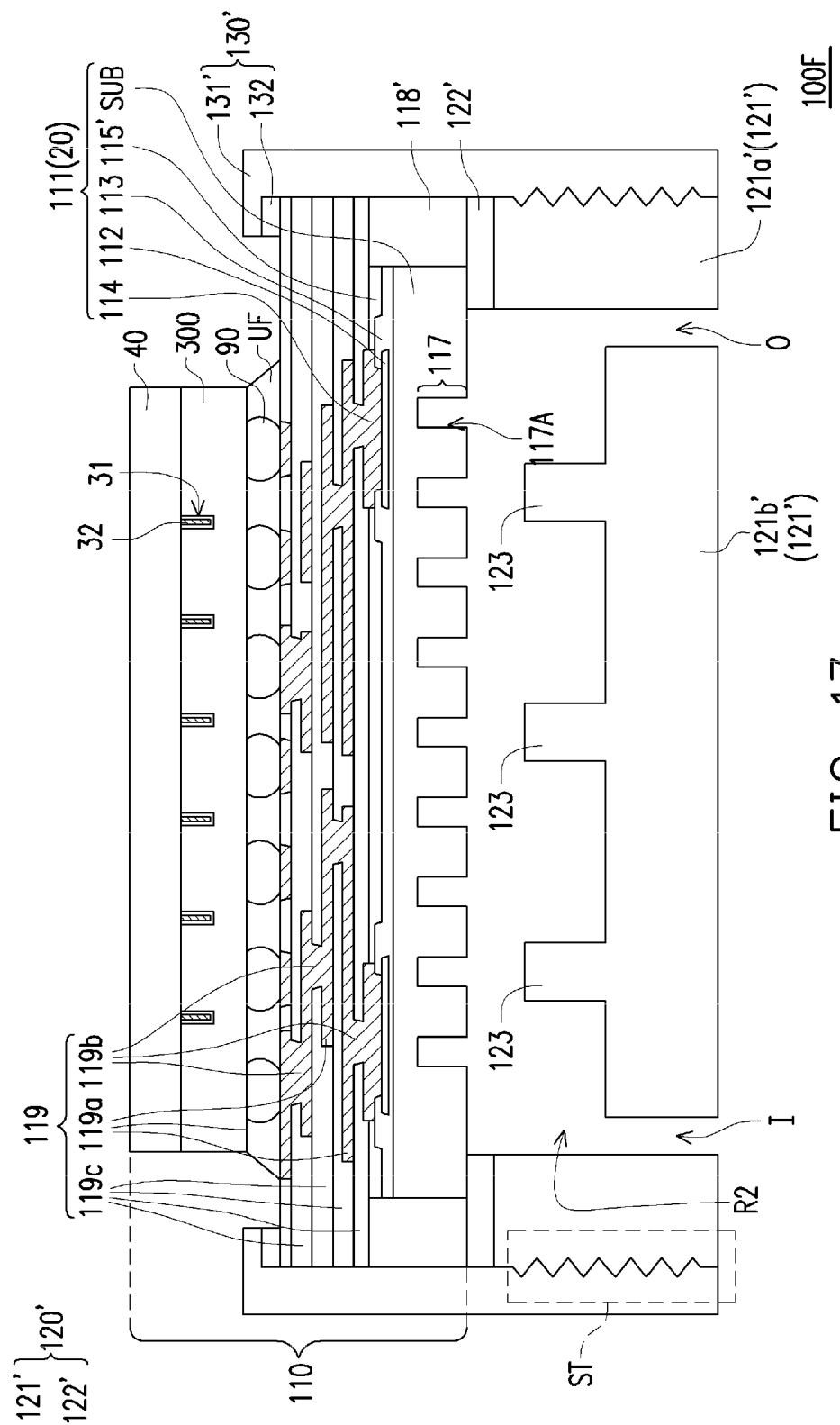

Referring to FIG. 17, in some alternative embodiments of the semiconductor device 100F, in the case which the wafer 20 is not singulated or the desired shape of the singulated semiconductor dies 111 may be round shape, the heat dissipation portion 131' and the side wall 121a' of the heat spreader 121' may have corresponding screw threads ST such that the heat dissipation portion 131' and the side wall 121a' of the heat spreader 121' may engage with each other. The first heat dissipation structure 120' and the second heat dissipation structure 130' clamp the chip package 110 into a firm combination situation to increase the assembly yield rate. In certain embodiments, the top of the chip package 40 may be higher than the top of the second heat dissipation structure 130'. In certain embodiments, the first sealing member 122' and the second sealing member 132' may prevent the chip package 110 from being directly in contact with the side wall 121a' of the heat spreader 121' and the heat dissipation portion 131' respectively to increase assembly yield rates of the first heat dissipation structure 120' and the second heat dissipation structure 130'.

Figure 18:
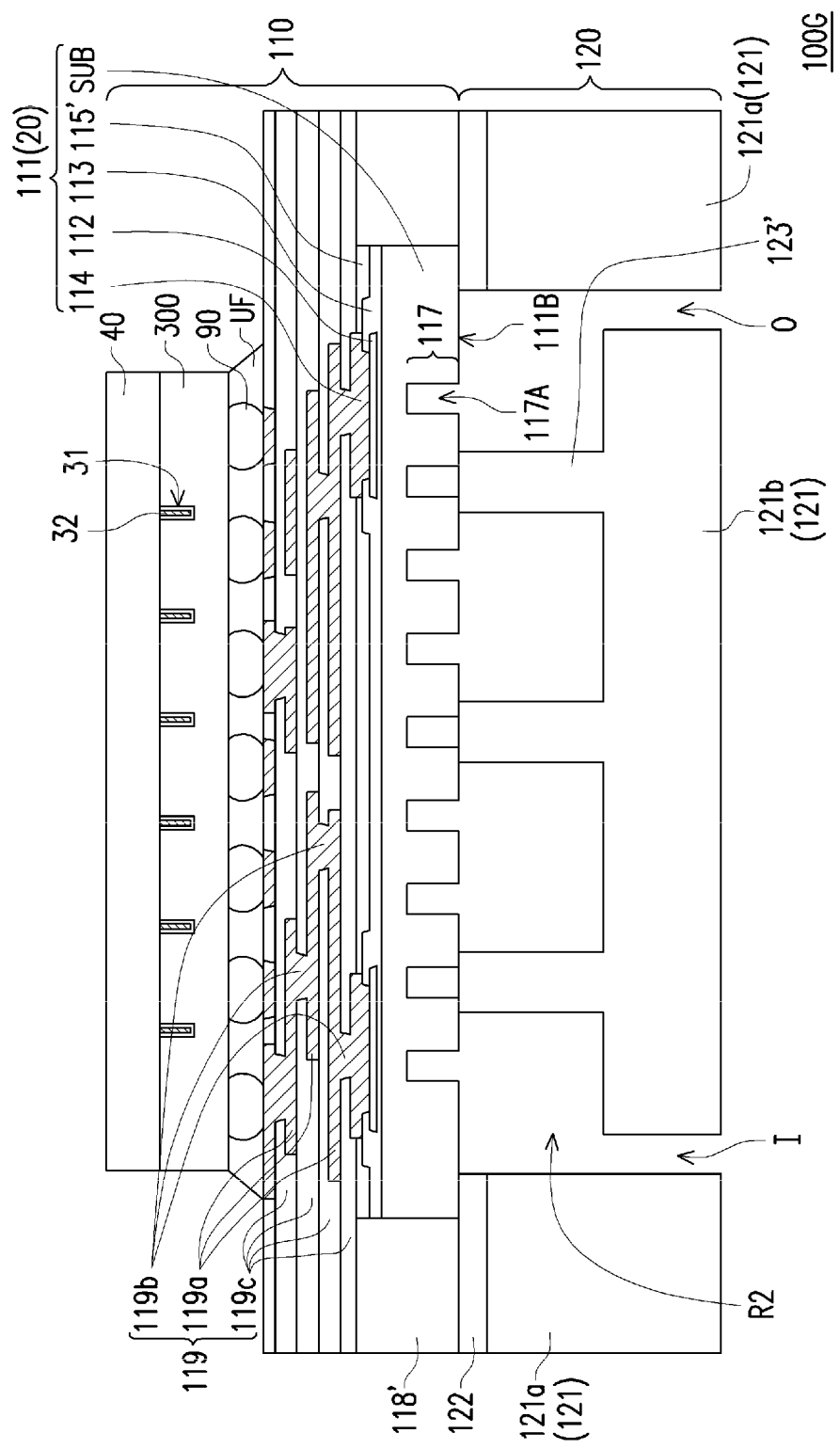

Compared to the semiconductor device 100 as illustrated in FIG. 11, the configuration of the inlet I and the outlet O in the semiconductor device 100G as illustrated in FIG. 18, is different. As shown in FIG. 18, the inlet I and the outlet O of the heat spreader 121" substantially extend and horizontally penetrate through side wall 121a" of the heat spreader 121", for example. In certain embodiments, when the cooling liquid flow through the recess R2, the influence of the gravity may decrease such that the cooling liquid may be more easily to fill the recess R2 and the thermal enhancement pattern 117 (e.g., the recesses 117A) and provide the ability to dissipate heat steadily.

Figure 19:
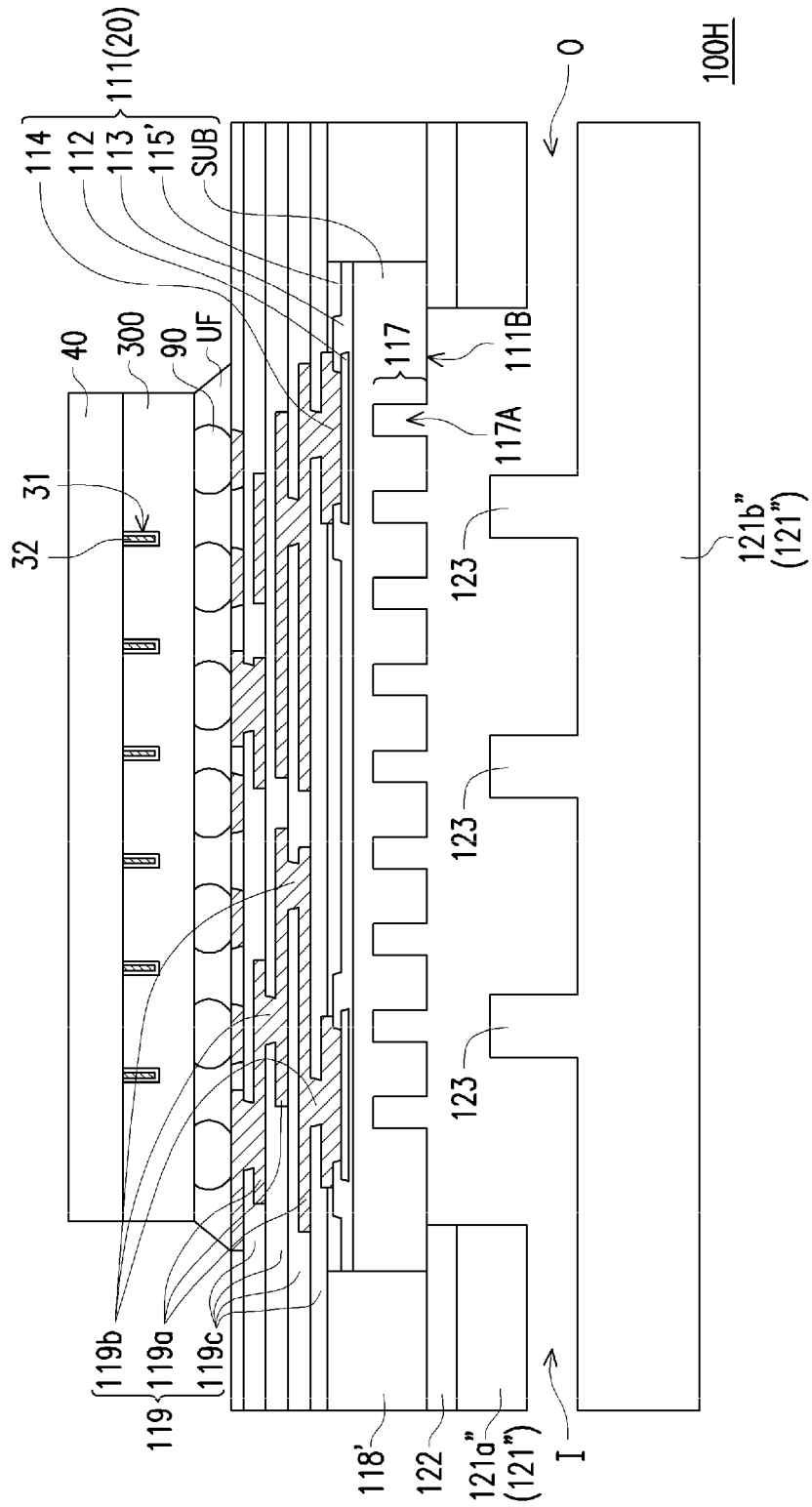

Compared to the semiconductor device 100 as illustrated in FIG. 1, the thermal enhancement protrusions 123' in the semiconductor device 100H of FIG. 19 may protrude toward and be in contact with the back surface 111B of the semiconductor die 111 or the wafer 20. The physical contact between the semiconductor die 111 or the wafer 20 and thermal enhancement protrusions 123' promotes the efficiency of heat conduction. The thermal enhancement protrusions 123' may serve as the channel wall such that the space between the thermal enhancement protrusions 123' may communicated the inlet I and the outlet O. On the other hand, it should be appreciated that the thermal enhancement protrusions 123' may not cover each of the recesses 117A. In some embodiments, when the thermal enhancement pattern 117 includes the recessed region R1 and fins F1/F2 formed therein (as shown in FIG. 5B), the thermal enhancement protrusions 123' may have fins that correspond and contact with the fins F1/F2 (e.g. thermal enhancement protrusions 123A discussed below). Therefore, the thermal enhancement pattern 117 and thermal enhancement protrusions 123' together defines a single flow channel. Such that, the cooling liquid introduced into the channel may flow in a single direction, thus increasing flow stability.

Figure 20B:
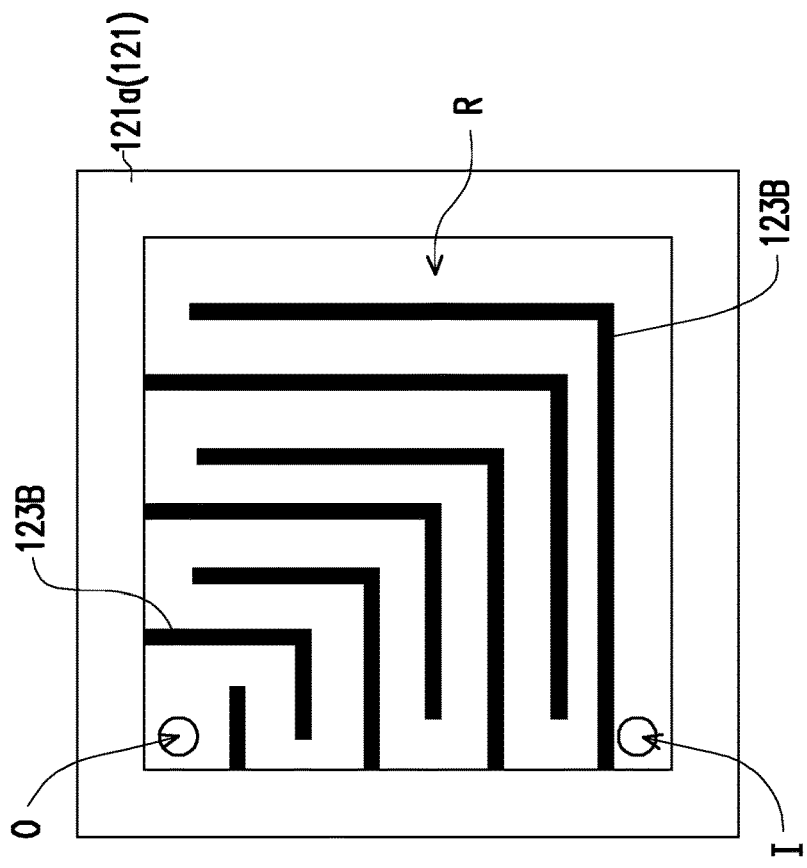
FIGS. 20A and 20B are top views of the heat spreader in accordance with some embodiments of the present disclosure.
Figure 20A:
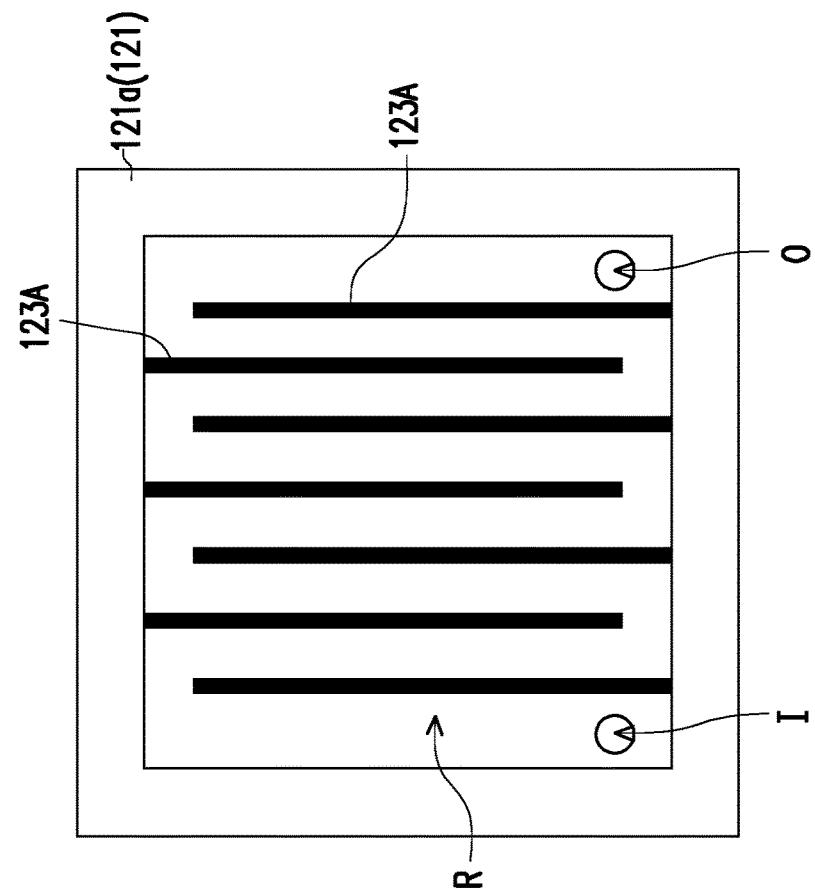

FIGS. 20A and 20B are top views of the heat spreader 121 illustrated in FIG. 19. As shown in FIG. 20A and FIG. 20B, different types of the thermal enhancement protrusions 123A and the thermal enhancement protrusions 123B are illustrated. The thermal enhancement protrusions 123A and the thermal enhancement protrusions 123B are surrounded by the side wall 121a of the heat spreader 121. In such embodiments, the space defined by the thermal enhancement protrusions 123A or 123B serves as the flow channel in which the cooling liquid may flow. Through the thermal enhancement protrusions 123A and the thermal enhancement protrusions 123B, various types of flow channels are defined and the cooling liquid flowing in the flow channel may increase the thermal exchange efficiency of the heat spreader 121.

FIG. 21 shows a semiconductor device 100I having more than one chip package. In detail, FIG. 21 shows two chip packages 110' that are still in wafer form (i.e. not singulated) being assembled with a heat dissipation structure 220. Moreover, each of the chip packages 110' includes to two semiconductor dies 111 and one adapter 300. In other words, after the chip packages 110' are formed (e.g. FIG. 10), the entire wafer-level package 50 having multiple chip packages 110' are processed to be assembled with the heat dissipation structure 220 without singulating chip packages 110'. The heat dissipation structure 220 may be similar to the heat dissipation structure 120 but only greater in size. To assemble the heat dissipation structure 220 with the wafer-level package 50, the heat dissipation structure 220 may include a top portion and bottom portion clamping the wafer-level package 50 using screws. The semiconductor device 100I may also be referred to as a modular device, including multiple chip packages 110' and multiple adapters 300. In some embodiments, each of the chip packages 110' may be different from one another and may perform different functions, and each of the adapters may also be different types of adapters (i.e. sockets) that accommodates different devices.

Furthermore, it should be appreciated that the different characteristics shown in the alternative embodiments (i.e., the characteristics are shown in FIG. 11 through FIG. 19 and FIG. 21) may combine with each other in accordance with the desired design of the packaging. The first heat dissipation structure 120' and the second heat dissipation structure 130' shown in FIG. 17 and the thermal enhancement protrusions 123' may be utilized simultaneously, for example.

In the above embodiments, by attaching adapters to redistribution circuit structures of the chip package, the reworkability and control over the chip packages is increased. That is, devices attached to the adapter may be replace more easily than devices directly attached to the redistribution circuit structure. In addition, forming thermal enhancement patterns directly on the back surface of the semiconductor die and providing thermal dissipation structure communicated with the thermal enhancement patterns improves the thermal performance of a semiconductor device. The semiconductor device may then be operated under a high power load for a longer time. Therefore, performance, reliability and lifetime of a semiconductor device are improved.

In accordance with some embodiments of the disclosure, a semiconductor device includes a first chip package, a heat dissipation structure connected to the chip package, and an adapter disposed over the first chip package and electrically connected to the semiconductor die. The first chip package includes a semiconductor die laterally encapsulated by an insulating encapsulant, wherein the semiconductor die has an active surface and a back surface opposite to the active surface.

In accordance with some embodiments of the disclosure, a semiconductor device includes a chip package, a heat dissipation structure connected to the chip package, and an adapter disposed over the chip package and electrically connected to the semiconductor die. The chip package includes a semiconductor die laterally encapsulated by an insulating encapsulant, wherein the semiconductor die has an active surface, a back surface opposite to the active surface, and a thermal enhancement pattern on the back surface. The heat dissipation structure includes a heat spreader having a flow channel for a cooling liquid, and the cooling liquid in the flow channel being in contact with the thermal enhancement pattern.

In accordance with some embodiments of the disclosure, a method of fabricating a semiconductor device including the following steps is provided: providing a semiconductor die having an active surface and a back surface opposite to the active surface; laterally encapsulating the semiconductor die by an insulating encapsulant; forming a redistribution circuit structure over the active surface of the semiconductor die and the insulating encapsulant; providing an adapter over the redistribution circuit structure to electrically connect to the semiconductor die through the redistribution circuit structure; and assembling a heat dissipation structure over the back surface of the semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first chip package comprising a semiconductor die laterally encapsulated by an insulating encapsulant, the semiconductor die having an active surface and a back surface opposite to the active surface;
a heat dissipation structure connected to the first chip package; and
an adapter disposed over the first chip package and electrically connected to the semiconductor die.

2. The semiconductor device as claimed in claim 1, wherein the first chip package further comprises a redistribution circuit structure disposed over the active surface of the semiconductor die and the insulating encapsulant, and the redistribution circuit structure electrically connects the adapter to the semiconductor die.

3. The semiconductor device as claimed in claim 1, further comprising a second chip package mounted on the adapter and electrically connected to the adapter.

4. The semiconductor device as claimed in claim 3, wherein a top surface of the adapter comprises a plurality of insertion holes and a plurality of terminals disposed in the plurality of insertion holes, and the second chip package is connected to the adapter through the plurality of insertion holes.

5. The semiconductor device as claimed in claim 3, wherein the second chip package is physically and electrically connected to the adapter through solder.

6. The semiconductor device as claimed in claim 1, wherein the adapter comprises a circuit board and a plurality of sockets formed on the circuit board.

7. The semiconductor device as claimed in claim 1, wherein the heat dissipation structure comprises a heat spreader having a flow channel for a cooling liquid, the back surface of the semiconductor die comprises a thermal enhancement pattern, and the cooling liquid in the flow channel being in contact with the thermal enhancement pattern.

8. The semiconductor device as claimed in claim 7, wherein the thermal enhancement pattern comprises a recess, and a cooling liquid that flows in the flow channel contacts the recess.

9. A semiconductor device, comprising:
a chip package comprising a semiconductor die laterally encapsulated by an insulating encapsulant, the semiconductor die having an active surface, a back surface opposite to the active surface, and a thermal enhancement pattern on the back surface;
a heat dissipation structure connected to the chip package, the heat dissipation structure comprising a heat spreader having a flow channel for a cooling liquid, and the cooling liquid in the flow channel being in contact with the thermal enhancement pattern; and
an adapter disposed over the chip package and electrically connected to the semiconductor die.

10. The semiconductor device as claimed in claim 9, wherein the thermal enhancement pattern comprises a recess distributed on the back surface of the semiconductor die.

11. The semiconductor device as claimed in claim 10, further comprising a thermal conductive material on the back surface of the semiconductor die and covering the recess.

12. The semiconductor device as claimed in claim 9, wherein the thermal enhancement pattern comprises a recessed region and a plurality of heat dissipation fins in the recessed region, the plurality of heat dissipation fins protrudes from a bottom of the recessed region toward the heat dissipation structure.

13. The semiconductor device as claimed in claim 12, wherein the plurality of heat dissipation fins comprises a first heat dissipation fin and a second heat dissipation fin, the first heat dissipation fin and the second heat dissipation fin define a meandering flow channel.

14. The semiconductor device as claimed in claim 9, wherein the thermal enhancement pattern comprises a recessed region and a plurality of heat dissipation pillars in the recessed region, the plurality of heat dissipation pillars protrudes from a bottom of the recessed region toward the heat dissipation structure.

15. The semiconductor device as claimed in claim 9, further comprising a redistribution circuit structure disposed between the adapter and the active surface of the semiconductor die to electrically connect the adapter to the semiconductor die.

16. The semiconductor device as claimed in claim 9, wherein the heat spreader further comprises an inlet and an outlet, and the flow channel is communicated between the inlet and the outlet.

17. A semiconductor device, comprising:
a first chip package comprising a semiconductor die, an insulating encapsulant laterally encapsulating the semiconductor dies, and a redistribution circuit structure disposed over the semiconductor die and the insulating encapsulant;
a heat dissipation structure connected to the first chip package;
an adapter disposed over the first chip package, wherein the adapter is electrically connected to the semiconductor die through the redistribution circuit structure; and
a second chip package mounted on the adapter and electrically connected to the first chip package through the adapter and the redistribution circuit structure.

18. The semiconductor device as claimed in claim 17, wherein a top surface of the adapter comprises a plurality of insertion holes and a plurality of terminals disposed in the plurality of insertion holes, and the second chip package is connected to the adapter through the plurality of terminals of the adapter.

19. The semiconductor device as claimed in claim 17, wherein the second chip package is physically and electrically connected to the adapter through solder.

20. The semiconductor device as claimed in claim 17, wherein the heat dissipation structure comprises a heat spreader having a flow channel for a cooling liquid, the back surface of the semiconductor die comprises a thermal enhancement pattern, and the cooling liquid in the flow channel being in contact with the thermal enhancement pattern.

* * * * *